US008188735B2

(12) United States Patent
Derakhshan et al.

(10) Patent No.: US 8,188,735 B2
(45) Date of Patent: May 29, 2012

(54) RESOLUTION ENHANCED T1-INSENSITIVE STEADY STATE IMAGING (RE-TOSSI)

(75) Inventors: Jamal J. Derakhshan, Cleveland Heights, OH (US); Mark A. Griswold, Shaker Heights, OH (US); Jeffrey L. Duerk, Avon Lake, OH (US)

(73) Assignee: Case Western Reserve University

( * ) Notice: Subject to any disclaimer, the term of this patent is extended or adjusted under 35 U.S.C. 154(b) by 550 days.

(21) Appl. No.: 12/290,343

(22) Filed: Oct. 29, 2008

(65) Prior Publication Data
US 2009/0177075 A1  Jul. 9, 2009

Related U.S. Application Data

(60) Provisional application No. 61/000,979, filed on Oct. 30, 2007.

(51) Int. Cl.
*G01V 3/00* (2006.01)
(52) U.S. Cl. .......................... 324/307; 324/309; 324/318
(58) Field of Classification Search .......... 324/300–322; 600/407–435; 382/128–131
See application file for complete search history.

(56) References Cited

U.S. PATENT DOCUMENTS

| 4,812,760 | A | * | 3/1989 | Bottomley et al. | 324/309 |
| 5,417,214 | A | * | 5/1995 | Roberts et al. | 600/413 |
| 6,400,151 | B1 | * | 6/2002 | Haase et al. | 324/309 |
| 2009/0177075 | A1 | * | 7/2009 | Derakhshan et al. | 600/410 |
| 2010/0219829 | A1 | * | 9/2010 | Rehwald et al. | 324/309 |

OTHER PUBLICATIONS

Schmitt, P., et al., "T-One Insensitive Steady State Imaging (TOSSI): Obtaining TrueFISP Images With Pure T2 Contrast", Proc. Intl. Soc. Mag. Reson. Med., 11, (2003), p. 551.*

* cited by examiner

*Primary Examiner* — Melissa Koval
*Assistant Examiner* — Tiffany Fetzner
(74) *Attorney, Agent, or Firm* — J T Kalnay

(57) ABSTRACT

Systems, methods, and other embodiments associated with RE-TOSSI are described. One system embodiment includes an MRI apparatus configured to produce a RE-TOSSI pulse sequence and to acquire T2-weighted images in response to the RE-TOSSI pulse sequence. An example RE-TOSSI pulse sequence includes a TOSSI portion and a non-inverting, non-TOSSI portion.

19 Claims, 25 Drawing Sheets

Spin Echo / Turbo Spin Echo - 110

Prepared Imaging - 120

TOSSI - 130

TOSSI - 140

Imaging Periods 510 520 530

RESOLUTION ENHANCED T1-INSENSITIVE STEADY STATE IMAGING (RE-TOSSI)

PRIORITY CLAIM

This application claims the benefit of U.S. Provisional Patent Application 61/000,979 filed Oct. 30, 2007, by the same inventors.

FEDERAL FUNDING NOTICE

The invention was developed with federal funding supplied under Federal Grant No. T32 GM007250 provided by the NIH (National Institute of Health). The Federal government has certain rights in the invention.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

In TOSSI (T1-insensitive Steady State Imaging), unequally spaced inversion pulses are placed throughout a low flip angle (FA) balanced steady-state free precession (bSSFP) or TrueFISP (True Fast Imaging With Steady State Precession) acquisition. These inversion pulses eliminate T1 contrast from bSSFP images of tissues by balancing the signal gained and lost via T1 relaxation in states parallel and anti-parallel to the main magnetic field. The resulting signal variations depend on T2 contrast.

SUMMARY

In Resolution Enhanced TOSSI (RE-TOSSI) the inversion pulses in TOSSI are eliminated after an adjustable period of time after the center of k-space is acquired. This results in a TOSSI-non-TOSSI combined acquisition technique. In RE-TOSSI, magnetization approaches a steady state value (e.g. bSSFP value) in the outer regions of k-space instead of decaying toward zero. RE-TOSSI, as compared to TOSSI, provides improved spatial resolution, faster image acquisition rate, lower radiofrequency (RF) energy deposition, and improved off-resonance properties in the outer regions of k-space. For example, experimental results show that RE-TOSSI provides a 60% faster acquisition than TOSSI. Experimental results also indicate that RE-TOSSI is 27% faster than a HASTE (Half-Fourier Acquisition Single-Shot Turbo Spin Echo) acquisition. Compared to both techniques there is 74% reduction in average RF power transmission. While the magnitude of the transverse magnetization of TOSSI decreases throughout the acquisition, the transverse magnetization of RE-TOSSI remains more constant throughout acquisition. RE-TOSSI images have improved spatial resolution compared to TOSSI. Thus, RE-TOSSI provides improvements over conventional acquisition techniques for certain MRI applications.

In one example, inversion pulses are removed when the magnetization is in the aligned state so that the magnetization continually increases instead of being brought to zero. This facilitates producing a more constant signal in k-space leading to a narrower point spread function and having more signal to encode the outer regions of k-space that are associated with providing resolution. The adjustable parameter $\lambda$ determines at what point the TOSSI inversions are stopped and also modifies the decay curves and point spread functions. Therefore, example RE-TOSSI systems and methods may reduce the width of the point spread function (PSF) to where it approaches a near ideal PSF.

MRI Basics

Magnetic resonance imaging (MRI) is a diagnostic imaging technique in which image contrasts may be generated. MRI uses a strong magnetic field to polarize a sample. Different image contrasts may be sensitive to different pathologies. Two image contrasts for diagnostic medicine are T1 contrast and T2 contrast. T1 (longitudinal) contrast corresponds to the rate at which magnetization develops parallel to the main magnetic field. T2 transverse contrast corresponds to the rate at which magnetization disappears perpendicular to the main magnetic field.

T2 contrast is often used to facilitate identification of tumors, tissue affected by stroke and other lesions, pathologies, and other differences between normal and diseased tissue. Thus, T2 contrast is useful in clinical imaging. Typically, T2 contrast is generated using a spin-echo (SE) or turbo-spin-echo (TSE) sequence. A single spin-echo is formed through a combination of a 90 degree pulse and a 180 degree pulse. The 90 degree pulse generates signal perpendicular to the main magnetic field and is followed by the 180 degree pulse that refocuses transverse magnetization to form an echo. A purely T2 weighted spin echo signal may be acquired at a point in time after the 180 degree pulse. The time at which the echo is acquired, the echo time (TE), occurs at a time after the 180 degree pulse that is equal to the spacing between the 90 degree pulse and the 180 degree pulse. While a "purely T2 weighted" signal is described, it will be appreciated by one skilled in the art that MR images may combine proton density, T1 weighting, and T2 weighting. Thus, "purely T2 weighted" refers to imaging with reduced and/or minimized T1 effects, and in which the differences in signal levels that exist due to T2 variations between tissues are also much greater than those due to proton density differences.

Single spin-echo imaging sequences that produce pure T2 contrast may be too slow for certain applications. In some cases, up to 5-10 minutes may be required to acquire images using single spin-echo imaging. As a result, pure T2 contrast sequences may have limited use, or be difficult to apply, in clinical MRI. Thus, turbo or multiple spin-echo sequences may be employed. These sequences typically use multiple, equally spaced 180 degree pulses after the first 90 degree pulse to generate more than one spin echo signal. While a 180 degree pulse is described, it is to be appreciated that some sequences may employ a tip angle of less than 180 degrees to reduce RF energy deposition while maintaining tissue contrast. A sample turbo spin echo sequence is illustrated in FIG. 1 at 110. Note that an initial 90 degree pulse is omitted in some sequences illustrated in FIG. 1. Sequence 110 may facilitate faster acquisition than a single spin-echo imaging sequence. However, if the 180 degree pulses are imperfect, unwanted T1 weighting may be generated in the images. The T1 weighting may result from magnetization that has relaxed parallel to the main magnetic field during the acquisition of the image. In addition, sequence 110 may require undesirably high depositions of radio-frequency (RF) power in the patient that may undesirably heat the patient. Additionally, RF deposition may be exacerbated in apparatus employing high magnetic field strengths.

FIG. 1 also illustrates a sequence 120 illustrating T2-prepared imaging. This type of imaging includes a preparation phase to generate T2 contrast. The preparation phase may be followed by another type of imaging sequence (e.g., gradient-echo sequence). T2-prepared imaging has conventionally been limited to cardiac imaging to generate contrast between blood vessels and cardiac tissue. T2-prepared imaging may see limited use because T2 contrast fades as an imaging sequence proceeds. Thus, this method is not broadly used as image intensity depends on underlying T1 relaxation, which is itself dependent on the actual imaging sequence used.

Another conventional technique includes using hyper-echoes to generate T2 weighted images. This technique includes applying a pattern of arbitrary pulse angles and phases followed by a 180 degree pulse and then applying the same pattern of pulses in reverse. This may produce a single T2 weighted echo. This echo may be referred to as a hyper-echo. While these sequences may be used to regain T2 weighting after a long series of pulses, only the hyper-echoes are ensured to be T2 weighted, while other echoes in the train can have both T1 and T2 weighting.

The above-described methods share a common approach where an initial pulse (e.g., 90 degrees) is used to generate transverse magnetization that is then refocused using a second pulse(s) (e.g., 180 degree, near 180 degree) or other pulses for hyper-echo. Signals resulting from T1 relaxation are avoided or minimized and images with primarily T2 contrast are generated. However, when these pulses are imperfect, which is common, the techniques fail to generate pure T2 weighted images and instead produce a combination of T1 and T2 contrasts.

TOSSI Basics

One conventional method for reducing undesired T1 contrast in the detected signals of an MRI sequence included generating pure T2 weighted images. The method involved allowing signal from T1 relaxation to enter an image signal but cancelled contrast resulting from different T1 relaxation rates. The method yielded pure T2 weighting in the images. The method involved applying a train of non-equally spaced 180 degree pulses that alternatively flipped the longitudinal magnetization into parallel and anti-parallel states. This method has been referred to as T1-insensitive Steady State Imaging (TOSSI). Thus, most generally, a TOSSI sequence included at least three inversion pulses where the spacing between the two pairs of pulses was not equal. When the timing of the pulses was chosen appropriately, a constant, greater than zero, level of longitudinal magnetization may have been generated regardless of the underlying T1 relaxation rates of the various tissues. Additionally, when an imaging sequence was implemented in between the 180 degree pulses, images with pure T2 contrast may have been generated. Sample TOSSI sequences are illustrated in sequence 130 and sequence 140.

TOSSI shares some properties with but is fundamentally different from a technique that employs a series of equally spaced 180 degree pulses to maintain a constant level of zero longitudinal magnetization. The equally spaced technique may be used as an image preparation scheme where no imaging is performed in between the 180 degree pulses. TOSSI also shares some properties with but is fundamentally different from a Dixon technique that employs multiple non-equally spaced pulses as a preparation scheme to generate magnetization for fixed time points in the imaging sequence so that two types of images can be formed. A first image concerns fat plus water while a second image concerns fat minus water. The Dixon technique highlights the T1 contrast for angiographic applications and does not cancel the effects of T1 relaxation.

FIG. 2 illustrates an example TOSSI sequence 200. Sequence 200 includes an initial 180 pulse 210, an imaging portion 220, an inversion pulse 230, another imaging portion 240, another inversion pulse 250, and another imaging portion 260. In sequence 200, the inversion pulses 230 and 250 are not exactly 180 degree pulses. It is to be appreciated that inverting pulses need not be exactly 180 degree pulses and thus may be less than 180 degrees. It will also be appreciated that the 180 degree pulses can be implemented at places in an imaging sequence where transverse magnetization is not present. Using this placement in combination with appropriate spoiling, the 180 degree pulses will not generate spin-echoes as is the case in the spin and turbo spin echo sequences. In TOSSI, the 180 degree pulses flip magnetization from parallel to anti-parallel states to cancel the T1 contrast. Unwanted transverse magnetization is spoiled using magnetic field gradients.

In one embodiment, TOSSI may be implemented with a TrueFISP imaging sequence. While a TrueFISP sequence is described, it is to be appreciated that other non-TOSSI, non-inverting sequences may be employed. The signal associated with TrueFISP imaging has a complicated relationship depending on TE, TR, tip angle, tissue T1, tissue T2, field inhomogeneity, and so on. The evolution of signal from different tissues with different T1s and T2s is shown in FIG. 3. Using this approach, a line of k-space data may be acquired in approximately 5 ms.

FIG. 3 illustrates a graph 300 of several sets of different T2s (310-350). Different lines sharing the same identifier (e.g., the three lines identified as 310) correspond to different T1s. If a sequence was purely T2 weighted (e.g., primarily T2 weighted) then all lines sharing an identifier would overlap exactly. However, since the TrueFISP sequence is affected by T1, different tissues with different T1s show different signal levels at different parts of the imaging sequence, resulting in the T2/T1 contrast.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DEFINITIONS

Figure 1:
FIG. 1 illustrates example pulse sequences.
Figure 1:
Figure 1:
Figure 1:
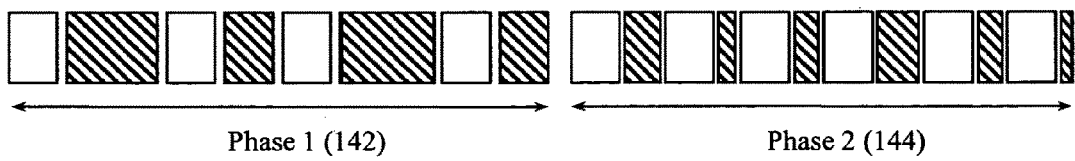
Figure 1:
Figure 2:
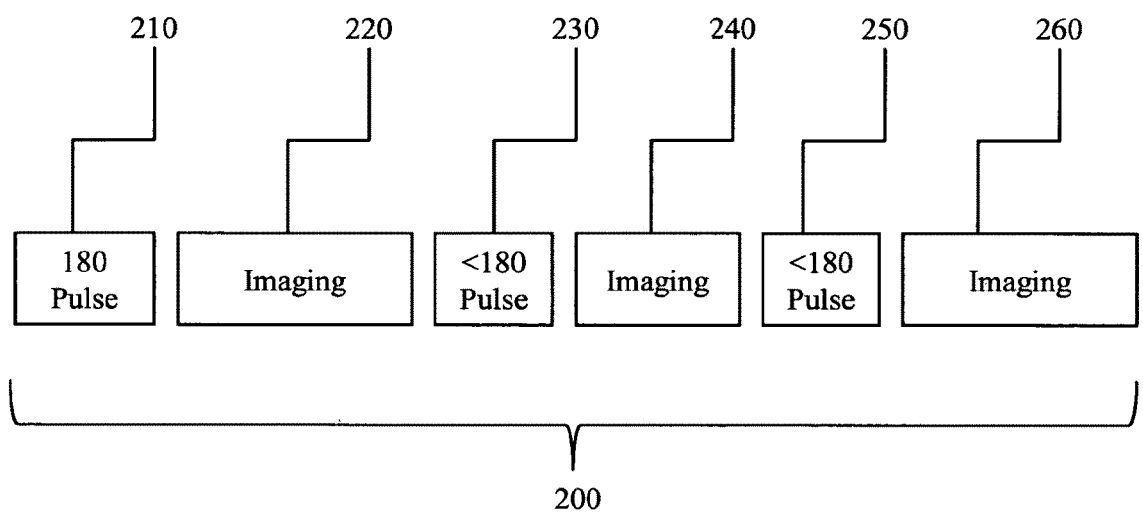
FIG. 2 illustrates an example pulse sequence.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component", as used herein, refers to a computer-related entity (e.g., hardware, firmware, software, software in execution, combinations thereof). Computer components may include, for example, a process running on a processor, a processor, an object, an executable, a thread of execution, a program, and a computer. A computer component(s) may reside within a process and/or thread. A computer component may be localized on one computer and/or may be distributed between multiple computers.

"Computer-readable medium", as used herein, refers to a medium that participates in directly or indirectly providing signals, instructions and/or data that can be read by a machine (e.g., computer). A machine-readable medium may take forms, including, but not limited to, non-volatile media (e.g., optical disk, magnetic disk), and volatile media (e.g., semiconductor memory, dynamic memory). Common forms of machine-readable mediums include floppy disks, hard disks, magnetic tapes, RAM (Random Access Memory), ROM (Read Only Memory), CD-ROM (Compact Disk ROM), and so on.

"Data store", as used herein, refers to a physical and/or logical entity that can store data. A data store may be, for example, a database, a table, a file, a list, a queue, a heap, a memory, a register, a disk, and so on. In different examples a data store may reside in one logical and/or physical entity and/or may be distributed between multiple logical and/or physical entities.

"Logic", as used herein, includes but is not limited to hardware, firmware, software and/or combinations thereof to perform a function(s) or an action(s), and/or to cause a function or action from another logic, method, and/or system. Logic may include a software controlled microprocessor, discrete logic (e.g., application specific integrated circuit (ASIC)), an analog circuit, a digital circuit, a programmed logic device, a memory device containing instructions, and so on. Logic may include a gate(s), a combinations of gates, other circuit components, and so on. In some examples, logic may be fully embodied as software. Where multiple logical logics are described, it may be possible in some examples to incorporate the multiple logical logics into one physical logic. Similarly, where a single logical logic is described, it may be possible in some examples to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Software", as used herein, includes but is not limited to, one or more computer instructions and/or processor instructions that can be read, interpreted, compiled, and/or executed by a computer and/or processor. Software causes a computer, processor, or other electronic device to perform functions, actions and/or behave in a desired manner. Software may be embodied in various forms including routines, algorithms, modules, methods, threads, and/or programs. In different examples software may be embodied in separate applications and/or code from dynamically linked libraries. In different examples, software may be implemented in executable and/or loadable forms including, but not limited to, a stand-alone program, an object, a function (local and/or remote), a servelet, an applet, instructions stored in a memory, part of an operating system, and so on. In different examples, computer-readable and/or executable instructions may be located in one logic and/or distributed between multiple communicating, co-operating, and/or parallel processing logics and thus may be loaded and/or executed in serial, parallel, massively parallel and other manners.

Suitable software for implementing various components of example systems and methods described herein may be developed using programming languages and tools (e.g., Java, C, C#, C++, SQL, APIs, SDKs, assembler). Software, whether an entire system or a component of a system, may be embodied as an article of manufacture and maintained or provided as part of a machine-readable medium.

"User", as used herein, includes but is not limited to, one or more persons, software, computers or other devices, or combinations of these.

Detailed Description

Figure 3:
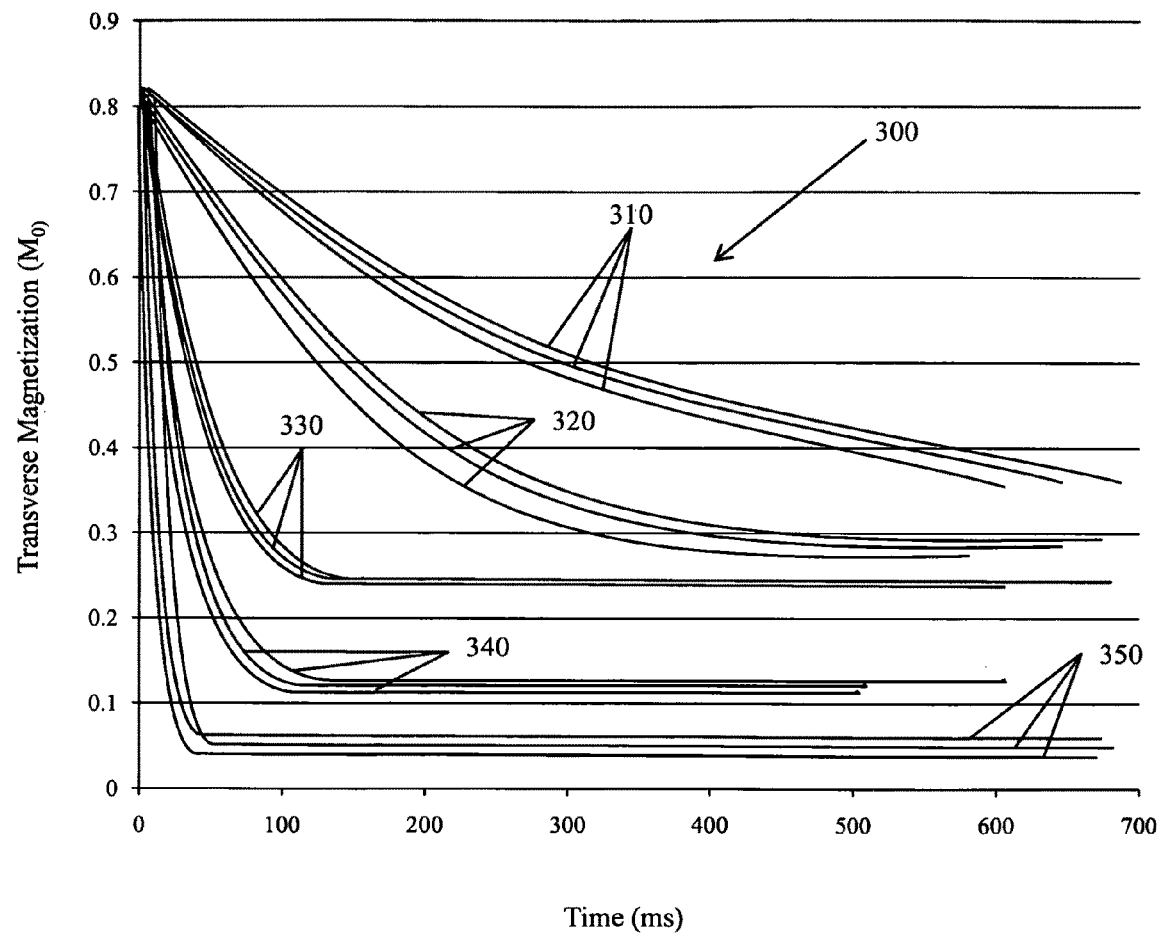
FIG. 3 illustrates a graph associated with TrueFISP.
Figure 4:
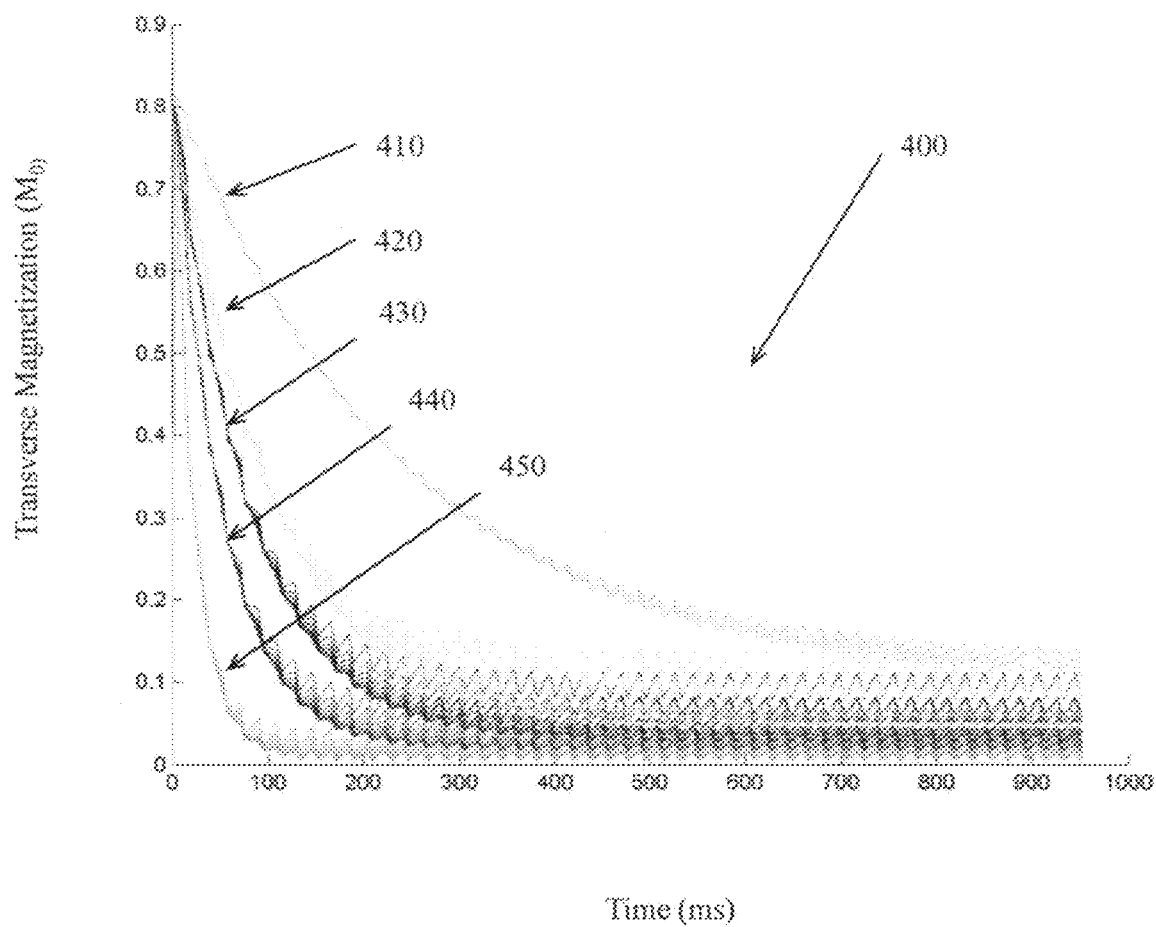
FIG. 4 illustrates a graph associated with TOSSI.

A TOSSI sequence of 180 degree pulses with TrueFISP imaging in between the pulses yields the relaxation illustrated in FIG. 4. In this example, the magnetization is in the parallel state for 60 ms followed by 20 ms anti-parallel. For the example illustrated in FIG. 4, magnetization oscillates around a particular level for the beginning of the sequence. This results in primarily T2 relaxation during this portion of the imaging sequence. As in FIG. 3, the multiple line groups correspond to different T2s (410-450), and the different lines sharing an identifier correspond to varying T1s.

Figure 5:
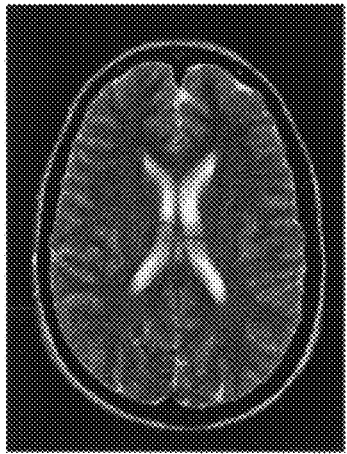
FIG. 5 illustrates a set of images associated with TOSSI.
Figure 5:
Figure 5:
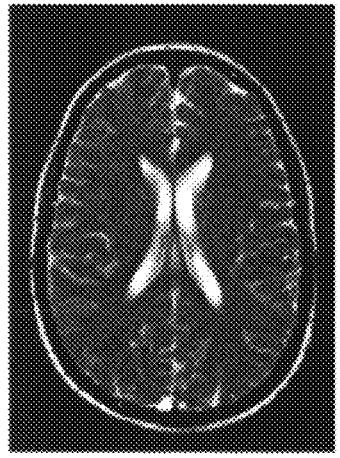

FIG. 5 illustrates a turbo-spin-echo image 510 acquired over 3 minutes, a TOSSI image 520 acquired over 2 seconds, and a normal TrueFISP image 530 acquired over 2 seconds. The normal TrueFISP contrast has been altered using TOSSI to be similar to that of the T2 weighted turbo-spin-echo image. The TOSSI contrast may be more accurate because subcutaneous fat, which has a short T2 value, is artificially bright in the turbo-spin-echo image 510, while it is correctly dark in the TOSSI image 520. The subcutaneous fat is also particularly bright in the TrueFISP image 530 due to the short T1.

Figure 6:
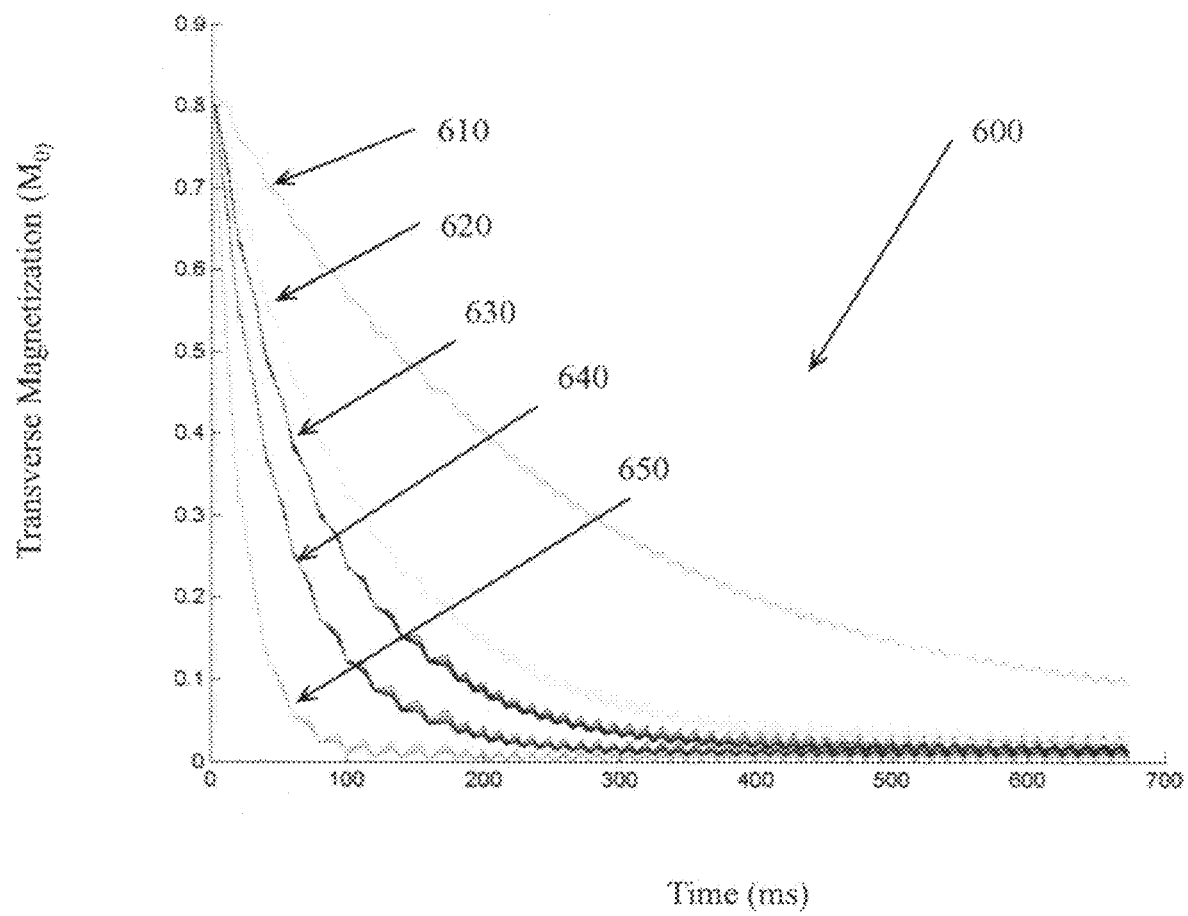
FIG. 6 illustrates a chart associated with TOSSI.

In different examples TOSSI may involve more complex implementations. For example, an inversion pattern may change throughout the sequence to achieve pure T2 contrast through the acquisition. The change may be continual. In TOSSI the different patterns still include inverting (e.g., 180 degree, near 180 degree) pulses. FIG. 6 illustrates a graph 600 of several sets of T2s (610-650). The beginnings of the graphed items are identical to those examples illustrated in FIG. 4 for the first ~500 ms, but then differ in that they are followed by a pattern of 30 ms parallel and 20 ms anti-parallel. In this example a more pure T2 contrast is observed throughout the acquisition. Recall that TOSSI, described most generally, involves a pulse sequence having at least three inversion pulses, where the spacing between the inversion pulses is not equal.

Primarily T2-weighted contrast has proven valuable for the diagnosis of pathology using MRI. However, clinical T2-weighted contrast may have been slow and/or suffered from spatial blurring. TOSSI provided improvements over conventional pulse sequences due to its primarily T2 weighted contrast and prolonged signal decay compared to HASTE. For example, TOSSI produced T2 contrast in the head in short imaging times. However, TOSSI abdominal images may have been blurred due to the shorter T2 values found in the abdomen. Thus, this application describes systems and methods associated with RE-TOSSI that address some of the limitations of TOSSI.

T2 contrast provides excellent differentiation between normal and pathologic tissue. Yet T2 contrast techniques may have yielded suboptimal results. Therefore several hybrid imaging techniques have attempted to improve spatial resolution and accelerate critical applications. For example, a combined acquisition technique (CAT) applies distinct imaging modules in succession to exploit the favorable qualities of the different techniques in different regions of k-space. CAT acquisitions have been described that either use different imaging sequences or the same sequence with different parameters (e.g., bandwidth, flip angle).

TOSSI has been shown to generate multi-slice T2-weighted images in the head at 1-2 seconds per image. However, TOSSI's use in the body suffers from low spatial resolution in the single-shot acquisition. Thus, this application describes systems and methods associated with RE-TOSSI that improve the spatial resolution, off-resonance properties, RF energy deposition, and image acquisition time when compared to TOSSI. The example systems and methods achieve these improvements while maintaining the desired T2-weighted contrast. Additionally, in regions of high magnetic field homogeneity, fat appears hypointense in TOSSI and RE-TOSSI images (compared to TSE, HASTE and TrueFISP images), which decreases the need for additional fat suppression.

A RE-TOSSI sequence includes a first TOSSI portion followed by a second non-TOSSI, non-inverting portion. The TOSSI portion includes at least three inversion pulses separated by unequal spaces. The second portion may be, for example, a True-FISP portion. The decay rate $\lambda_1$ (not to be confused with $\lambda$ of RE-TOSSI described below) of the magnetization during the transient phase of the balanced SSFP sequence for on-resonance spins is given by the following equation:

$$\lambda_1 = E_1 \cos^2\left(\frac{\alpha}{2}\right) + E_2 \sin^2\left(\frac{\alpha}{2}\right) \quad [1]$$

where $E_{1,2} = e^{-TR/T_{1,2}}$ and $\alpha$ is the flip angle. This decay rate is a mixture of pure T1 decay (at low flip angles) and pure T2 decay (at flip angles near 180°). The following equation for the apparent relaxation time T1* can be derived from equation 1 assuming TR<<T1, T2:

$$T_1^* = \left[\frac{1}{T_1}\cos^2\left(\frac{\alpha}{2}\right) + \frac{1}{T_2}\sin^2\left(\frac{\alpha}{2}\right)\right]^{-1} \quad [2]$$

If T1 relaxation is eliminated (e.g., T1→∞), then the expression for T1* reduces to:

$$T_1^* = \left[\frac{1}{T_2}\sin^2\left(\frac{\alpha}{2}\right)\right]^{-1} \quad [3]$$

Without T1 relaxation, the equation for the transverse magnetization $M_{xy}$ as a function of time is given by:

$$M_{xy}(t) = M_0 \sin\left(\frac{\alpha}{2}\right) e^{-\frac{t}{T_2}\sin^2\left(\frac{\alpha}{2}\right)} \quad [4]$$

While the equation for the z magnetization as a function of time is:

$$M_z(t) = M_0 \cos\left(\frac{\alpha}{2}\right) e^{-\frac{t}{T_2}\sin^2\left(\frac{\alpha}{2}\right)} \quad [5]$$

In TOSSI, T1 contrast is eliminated for a given T2 species by spending the appropriate time in states parallel and anti-parallel to the main magnetic field. When the magnetization is parallel to $B_0$, T1 relaxation increases the magnitude of the magnetization vector by a rate proportional to $[M_0-|M_z(t)|]$. When the magnetization is anti-parallel to $B_0$, T1 relaxation reduces the magnitude of the magnetization by a rate proportional to $[M_0+|M_z(t)|]$. The ratio of the time spent in the parallel state relative to the anti-parallel state in order to balance the magnetization gained in the parallel state with that lost in the anti-parallel state and thereby eliminate T1 contrast is given by the following equation:

$$R(t) = \frac{T_P}{T_A} = \frac{M_0 + |M_z(t)|}{M_0 - |M_z(t)|} \qquad [6]$$

R(t) denotes the time dependent ratio of the time spent in the parallel state ($T_P$) to time spent in the anti-parallel ($T_A$) state. In the TOSSI pulse sequence a desired flip angle and T2 optimization factor ($T_2$Opt) is specified and used in conjunction with equations 5 and 6 in order to determine R(t). $T_A$ is determined by the specified number of readouts per anti-parallel block (reads per down or rpd) times TR plus the time needed for steady state preparation and storage as well as spoiling. The time in the parallel state ($T_P$) is then given by $R(t) \times T_A$. The number of readouts in the parallel state can then be calculated with the addition of some dead time to the parallel bSSFP block in order to fulfill equation 6.

Figure 7:
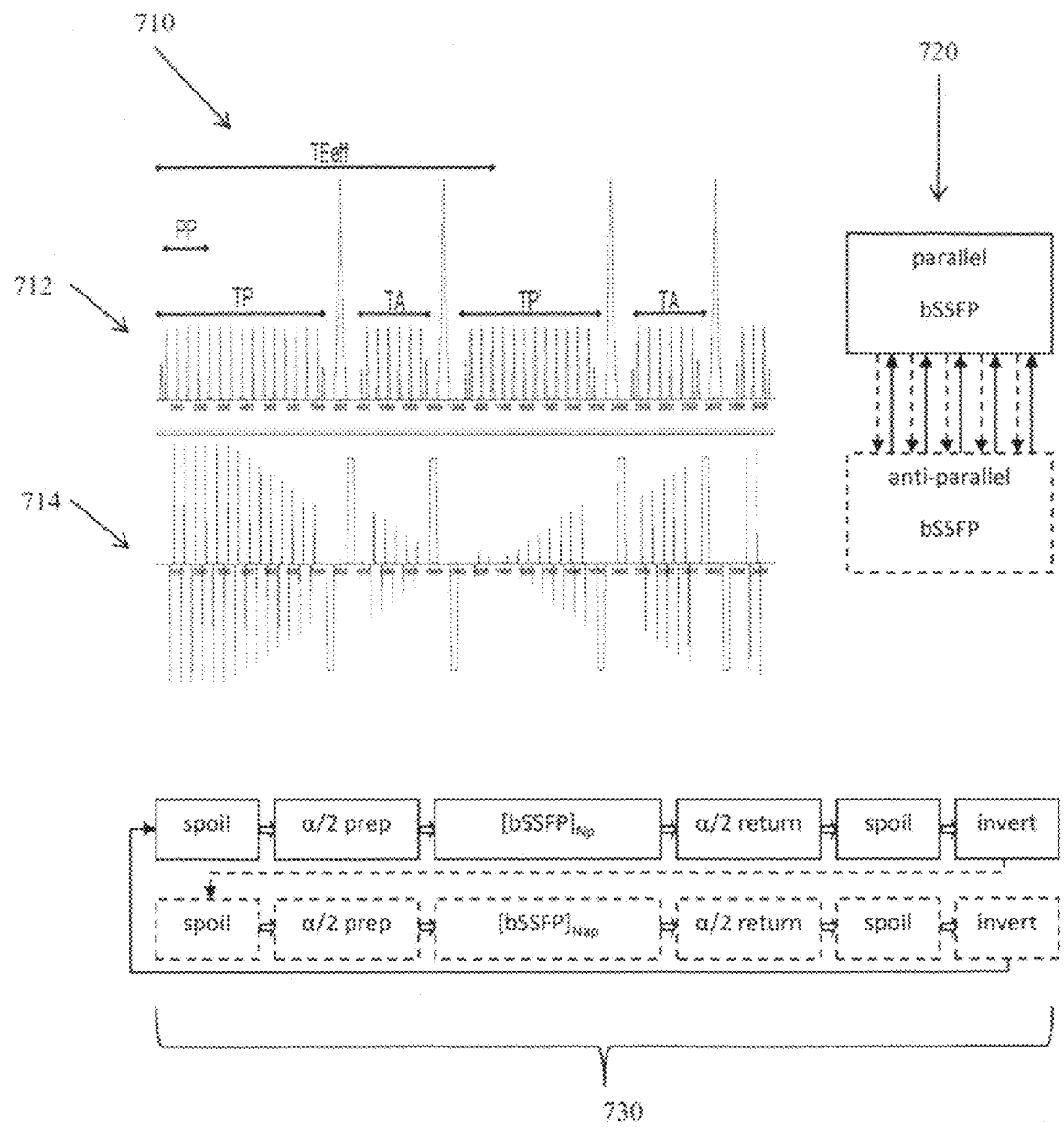
FIG. 7 illustrates some aspects of some TOSSI embodiments.

FIG. 7 illustrates some aspects of some TOSSI embodiments. Section 710 illustrates RF pulses 712 and phase encoding gradients 714 of an abbreviated TOSSI pulse sequence. In the figure, PP=prep pulses, TP=time in parallel state, TA=time in anti-parallel state, and TEeff=effective echo time. In section 710, adiabatic inversion pulses are used to invert the magnetization between the parallel and anti-parallel states. Transverse magnetization that is not realigned with the z axis by the α/2 pulses is eliminated using spoiling gradients. Section 720 illustrates a two state model for TOSSI. The magnetization is inverted periodically throughout the sequence by unequally spaced inversion pulses between two states, one parallel and one anti-parallel to $B_0$. Section 730 illustrates a TOSSI block diagram. In section 730, Np=number of bSSFP pulses in the parallel state, and Nap=number of bSSFP pulses in the anti-parallel state. The cycle repeats until the desired phase encoding lines in K-space are acquired. The solid boxes represent events while the bulk magnetization is parallel to $B_0$ while the dotted boxes represent events while the bulk magnetization is anti-parallel.

To demonstrate TOSSI signal decay and contrast, magnetization evolution simulations were performed using Matlab (The MathWorks Inc., Natick, Mass.). Pure T2 decay was simulated at 180° as well as at 50° (using equation 4) for the T2 values of tissue found in the abdomen such as cerebrospinal fluid (CSF), spleen, kidney, fat, liver and muscle (e.g., T2=500, 100, 75, 60, 56 and 50 msec). Chart 810 is a plot of signal decay as a function of time when a series of 180° pulses are used such as in the cases of SE and TSE sequences. Chart 820 shows a plot of the signal decay for the same T2 species when 50° pulses are used instead. The magnetization has a lower value compared to the 180° case to begin, however, the decay is much slower. The slower decay leads to less degradation of spatial resolution when signal is collected and encoded linearly through K-space. The magnetization evolution for the same tissues now using both T1 and T2 values (T1/T2=2400/500, 820/100, 650/75, 250/60, 590/76 and 900/50) was simulated during a bSSFP acquisition (FA=50°, TR=5.2 msec, 192 steps). Chart 830 shows the resulting signal evolution. As is well known, the signal value goes to a nonzero constant value (steady state) that is not strictly a function of T2. The simulations were repeated for the same tissue values using TOSSI (FA=50°, TR=5.2 msec, $T_2$opt=60 msec, 1 rpd, 192 steps). Chart 840 shows the resulting magnetization decay. Throughout the TOSSI acquisition, the transverse magnetization for the different tissues is stratified according to T2 values. The TOSSI decay curves for the simulated tissues with both T1/T2 values included are very close to the ideal pure T2 decay curves for the same T2 value (chart 820). This concordance is the basis of the "pure T2 contrast" associated with TOSSI.

Although TOSSI is composed of bSSFP imaging blocks, the magnetization does not approach a steady state value. Instead the inversion pulses cause the magnetization to steadily decrease from a starting value toward zero (chart 840). Despite the prolonged signal decay in TOSSI, compared to the HASTE-like counterpart (chart 810) there can be significant magnetization decay in the single-shot case. The decay may depend on T2 value and acquisition duration. This decay leads to degradation of spatial resolution in the phase encoding direction. This decay may become more problematic as the number of phase encoding lines increases and/or as the T2 value of the tissue decreases.

Example RE-TOSSI systems and methods remove the inversion pulses from the TOSSI acquisition when the magnetization is in the aligned state to reintroduce T1 relaxation effects to allow the magnetization to approach a steady state value instead of driving the magnetization to zero. This leads to improved spatial resolution. Section 920 demonstrates how a partial Fourier acquisition is used with the central region of k-space encoded first during the TOSSI portion of the acquisition and the outer region of k-space encoded second after the inversions are stopped (e.g., during the bSSFP portion of the acquisition). This acquisition maintains T2 contrast since the data around the center of k-space is acquired using TOSSI while improving spatial resolution due to the increased signal in the outer regions of k-space during the parallel bSSFP portion of the acquisition. The partial Fourier factor can be adjusted and TOSSI prep pulses can be used to change the effective echo time ($TE_{eff}$). This affects the degree of T2 contrast and the signal-to-noise ratio (SNR). The parameter λ describes the fraction of the k-space lines collected using TOSSI and has a range of 1 (all TOSSI) to 0 (all balanced SSFP). Note that $\lambda_1$ was used above to refer to the rate of magnetization decay during the transient portion of an SSFP acquisition while in this portion A is used to describe the relative fraction of TOSSI to non-TOSSI components of an RE-TOSSI acquisition in k-space.

Figure 9:
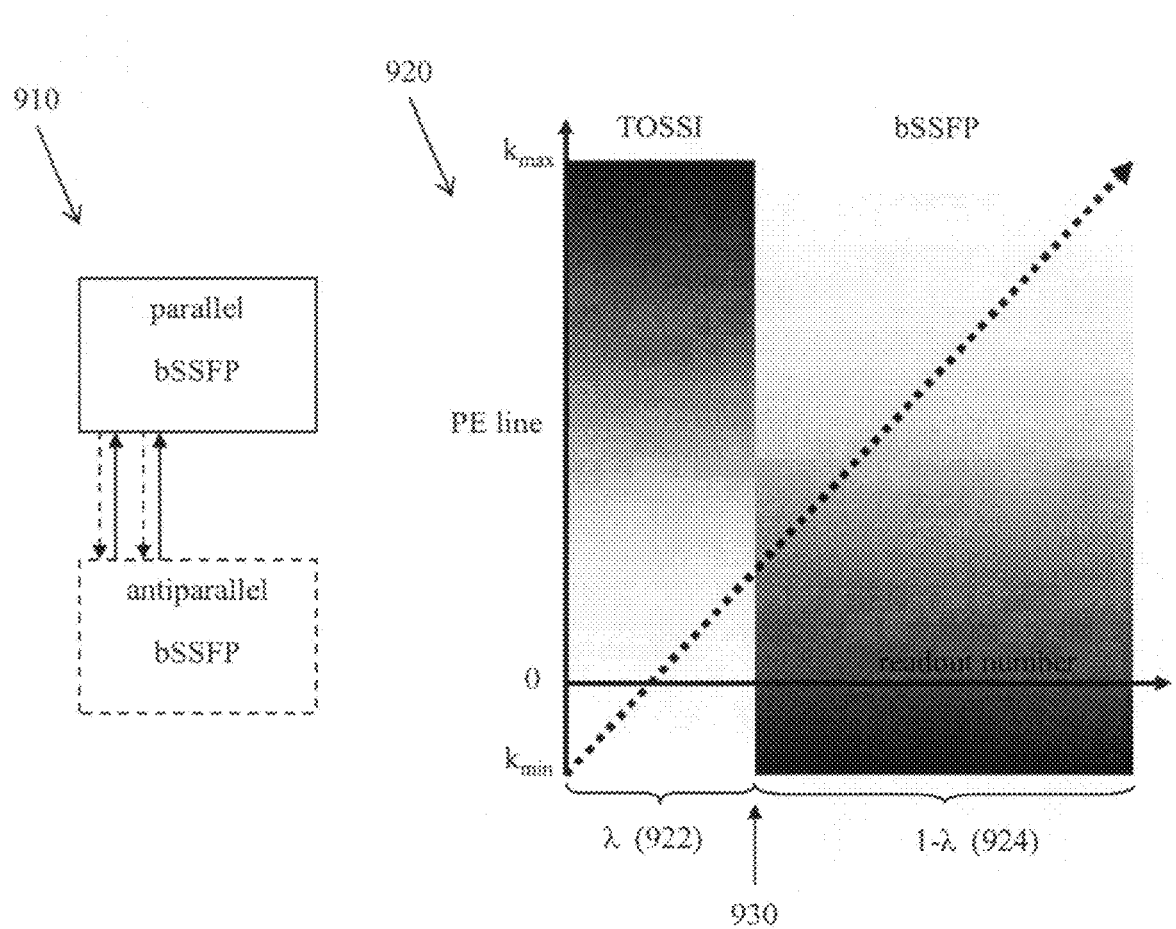
FIG. 9 illustrates some example aspects of RE-TOSSI.

FIG. 9 illustrates some example aspects of RE-TOSSI. Section 910 illustrates an example two state model for RE-TOSSI. During the first stage of the acquisition the magnetization is inverted between states parallel and anti-parallel to $B_0$ as in TOSSI. During the second stage the magnetization remains in the state parallel to $B_0$ allowing the magnetization to relax to a steady state value. Section 920 illustrates a schematic diagram of an example RE-TOSSI acquisition. The phase encoding (PE) line is plotted as a function of readout number. The fraction of readouts using TOSSI is denoted in region 922 by λ while the remaining fraction of readouts using balanced SSFP is denoted in region 924 by 1−λ. While balanced SSFP is described, it is to be appreciated that other non-inverting, non-TOSSI portions may be employed. This diagram depicts a partial Fourier acquisition where acquisition starts from slightly negative k-space PE line and progresses linearly to $+k_{max}$.

Simulations were performed to examine RE-TOSSI with respect to signal decay, contrast, and spatial resolution. Different abdominal tissues (CSF, spleen, kidney, fat, liver and muscle; $T_1/T_2$=2400/500, 820/100, 650/75, 250/60, 590/76 and 900/50) were simulated during TOSSI (FA=50°, TR=5.2 msec, $T_2$opt=60 msec, 1 rpd, 192 steps) and RE-TOSSI ($\lambda$=0.3, other parameters same as TOSSI) acquisitions. A zero-padded (8192 points) Fourier transform of the transverse magnetization decay curves was performed to obtain the point spread functions (PSF) of the two techniques for each tissue. A zero-padded (8192 points) Fourier transform of a constant function was also calculated to demonstrate an ideal PSF (point spread function) for comparison.

Figure 10:
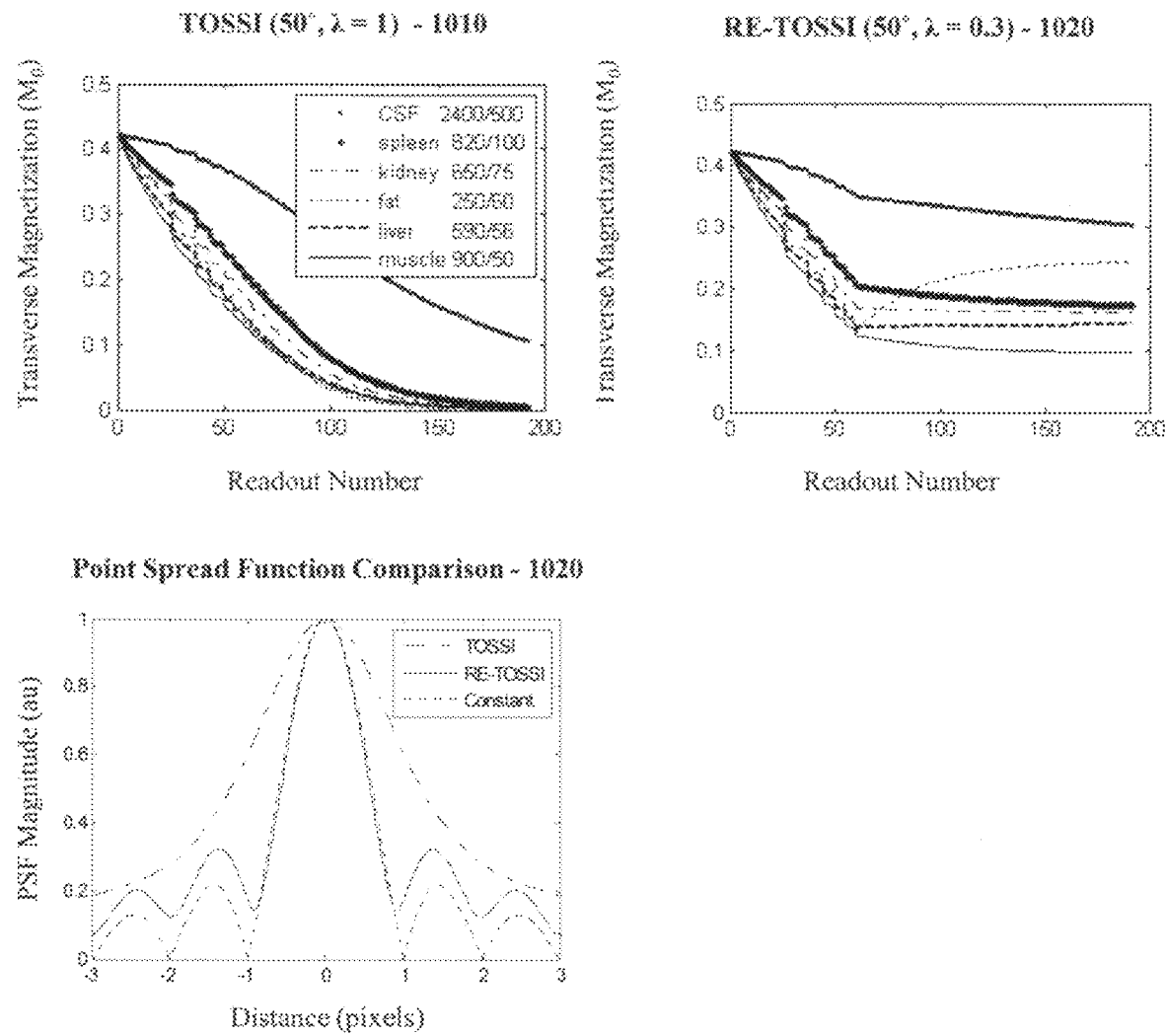
FIG. 10 illustrates several charts associated with RE-TOSSI.

FIG. 10 illustrates examples of simulated TOSSI (1010) and RE-TOSSI (1020) ($\lambda$=0.3) signal decay curves for on-resonance spins. Each line represents a different tissue with a different T1/T2 value (tissue type, T1/T2 given in 840 figure legend). For the first acquisition segment (e.g., lines 1-55), both sequences demonstrate T2 weighting as evidenced by the signal evolution curves segregation by T2 values. Note the elevated signal in the RE-TOSSI simulation 1020 compared with traditional TOSSI 1010 during the latter readouts (e.g., lines 55-192) where the later portion of the RE-TOSSI acquisition 1020 does not include inversion pulses. In RE-TOSSI, signals approach steady state values instead of continuing to decay as in traditional TOSSI.

Chart 1030 illustrates example TOSSI and RE-TOSSI PSF for simulated kidney tissue. For comparison, the simulated PSF of a tissue with T2=infinity is also plotted. In this example, the RE-TOSSI PSF has a full-width at half maximum (FWHM) that is 52.8% narrower than TOSSI. Additionally, the first and second side lobe amplitudes are decreased by 27.4% and 11.3% respectively. The RE-TOSSI PSF has a FWHM that approaches the ideal PSF. Differences include side lobe amplitudes that are 49.5% and 56.9% higher than the ideal/sinc PSF for the first and second side lobes respectively.

Experiments in phantoms determined the contrast and spatial resolution properties of RE-TOSSI. 50 ml syringes were prepared with agarose with the following weight to volume (wt/vol) agarose content: 0, 0.5, 1.0, 2.0 and 4.0%. The phantoms were placed in the head matrix coil (for signal reception) inside a 1.5 T Siemens Espree MR scanner (Erlangen, Germany). The T2 values of the phantoms were measured using a multi-contrast spin echo sequence (21 echo times between 18-388 msec, TR=10,000 msec). The T2 value of each phantom was calculated using fitting software. A multi-slice TSE (TE/TR=72/3000 msec, ETL=19), a multi-slice slice TrueFISP (FA=50°, TE/TR=2.3/4.7 msec), a multi-slice slice HASTE (TE/TR=63/3000 msec), a single slice TOSSI ($TE_{eff}$=415 msec, FA=50°, TR=5.2 msec, PF=4/8, 1 rpd, 50 prep pulses, BW=500 Hz/Px) and two different single slice RE-TOSSI ($\lambda$=0.5, $\lambda$=0.04) acquisitions were used to acquire images at the same location within the phantoms. Images had a 230 mm×230 mm field of view (FOV), 256×256 matrix, and 5 mm slice thickness.

To quantify the resolution properties of the different sequences, the edge response functions (ERF) were extracted from the phantom images and analyzed using established transfer function methods. The ERF were smoothed using a [1 2 1] kernel and differentiated to generate line spread functions (LSF). The modulation transfer function (MTF) was calculated as the normalized magnitude of the Fourier transform of the LSF. The information transfer function (ITF) was calculated as the square of the MTF. The cutoff frequency ($f_c$) was determined as the frequency at which the magnitude of the MTF reached 1/10 of its peak height. The area under the MTF curve (MTFA) and the equivalent bandpass (area under the ITF curve) were calculated. The optimal frequency response, defined as the maximum of the (MTF(k)×k) as a function of k (spatial frequency) was determined.

Figure 11:
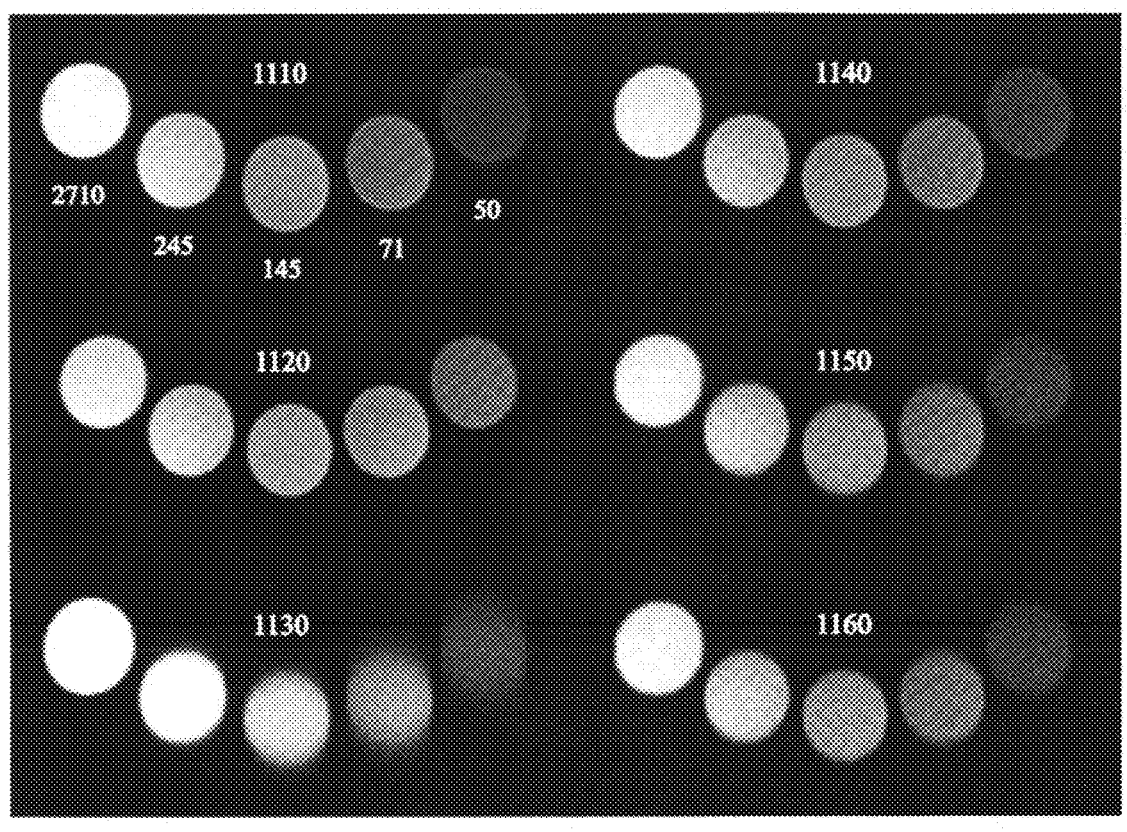
FIG. 11 illustrates some aspects of some TOSSI and RE-TOSSI embodiments
Figure 11:
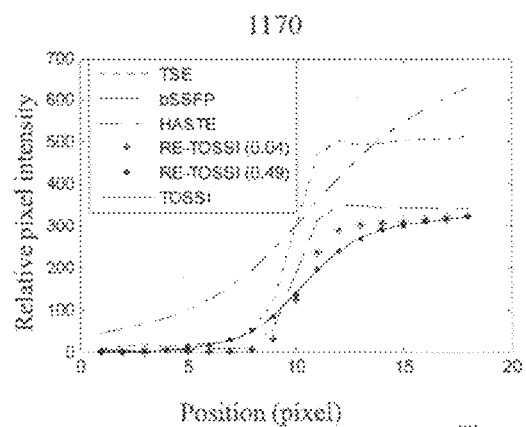
Figure 11:
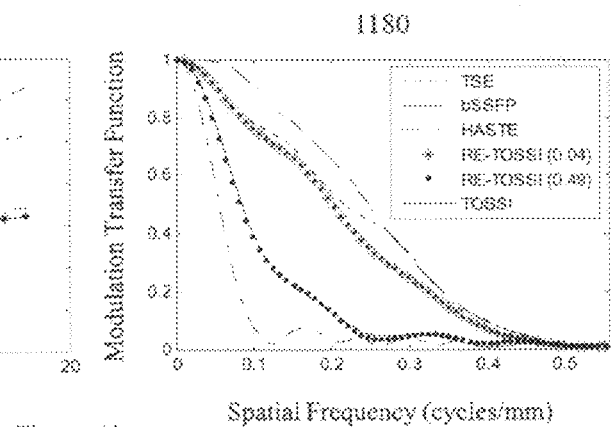

FIG. 11 illustrates imaging results on agarose phantoms. Image 1110 illustrates images generated using T2-weighted ($T_2W$) TSE. Image 1120 illustrates images generated using TrueFISP. Image 1130 illustrates images generated using HASTE. Image 1140 illustrates images generated using RE-TOSSI ($\lambda$=0.04). Image 1150 illustrates images generated using RE-TOSSI ($\lambda$=0.49), and image 1160 illustrates images generated using TOSSI ($\lambda$=1.0). Figure 1170 illustrates edge response functions of the T2=71 ms agarose containing vial for the six different images. Figure 1180 illustrates the modulation transfer function (MTF) for each of the six sequences. The T2 value of each phantom is presented below the phantom in figure 1110.

Examining FIG. 11 more closely yields the following results. Image 1110 shows the T2 contrast obtained using TSE. The SE-based estimate of the T2 value for each vial of the phantom is shown in the image. Note that the signal intensity drops from left to right as the T2 values get shorter. Image 1120 shows the results of the TrueFISP imaging. Note the diminished contrast between the agarose phantoms. Image 1130 shows results from the HASTE sequence. Note the increased degradation of spatial resolution along the phase encoding (vertical) direction as the T2 values decrease. Images 1140 and 1150 show the results of RE-TOSSI imaging with $\lambda$=0.04 and $\lambda$=0.49 respectively. Note the visual similarity in contrast between the RE-TOSSI images and that of the TSE. Note also the sharp edges of the phantoms in 1140. Image 1160 shows the result of imaging with TOSSI. Note the T2 contrast but the apparent loss of resolution at distinct edges. However, this loss of resolution appears to be less than in the HASTE image. The edge response functions (ERFs) are plotted in figure 1170. Note the decreased slope of the TOSSI and HASTE ERFs compared to TSE and bSSFP. The RE-TOSSI ($\lambda$=0.04) ERF has a higher slope than the TOSSI ERF. The modulation transfer functions for the six imaging techniques are presented in figure 1180. Note the widened MTF of RE-TOSSI ($\lambda$=0.04) compared to TOSSI indicating improved spatial resolution characteristics of the RE-TOSSI image compared to the TOSSI image. A quantitative comparison of the MTFs for the various techniques are presented in table 1.

TABLE 1

Summary of quantitative results of the phantom modulation transfer function (MTF) measurements[a]

| Sequence | Cutoff frequency[b] (c/mm) | MTFA[c] (c/mm) | Equivalent bandpass[d] (c/mm) | OFR[e] (c/mm) |
|---|---|---|---|---|
| bSSFP | 0.39 | 0.25 | 0.18 | 0.21 |
| TSE | 0.39 | 0.22 | 0.15 | 0.26 |
| RE-TOSSI ($\lambda$ = 0.04) | 0.37 | 0.21 | 0.14 | 0.17 |
| RE-TOSSI ($\lambda$ = 0.49) | 0.21 | 0.11 | 0.06 | 0.07 |
| TOSSI | 0.21 | 0.11 | 0.06 | 0.07 |
| HASTE | 0.09 | 0.07 | 0.04 | 0.04 |

[a] Nyquist limit for the experiment (0.9 mm pixel size) is 0.55 cycles/mm
[b] Cutoff frequency = frequency at 1/10 of peak amplitude
[c] MTFA = area under the MTF curve
[d] Equivalent bandpass = the area under the information transfer function (ITF(k) = MTF(k)$^2$)
[e] OFR = optimum frequency response = max of (MTF(k) × k) curve Imaging of an asymptomatic human volunteer was performed to assess the in-vivo abdominal imaging capability of RE-TOSSI. An asymptomatic human volunteer was placed head first, supine in the scanner bore. The body matrix coil was placed on the lower anterior thorax and abdomen of the volunteer. Transverse images at the same locations were acquired using a multi-slice TSE (TE/TR=60/3000, ETL=15), a multi-slice TrueFISP (FA=50°, TE/TR=2.1/4.2 msec), a multi-slice HASTE (TE/TR=62/3000 msec), a multi-slice traditional TOSSI (TE$_{eff}$=85 msec, FA=50°, TR=5.2 msec, T$_2$opt=90, half Fourier, 1 rpd, 1 prep pulse, BW=500) and a multi-slice RE-TOSSI ($\lambda$=0.2, TE$_{eff}$=96 msec, 3 prep pulses). The images were acquired with a 320 mm×240 mm FOV, 256×192 matrix and 5 mm slice thickness. The body matrix coil and the spine matrix coil in the table under the volunteer were used for signal reception. The acquisition time and RF power deposition for each scan as reported by the scanner were recorded.

Figure 12:
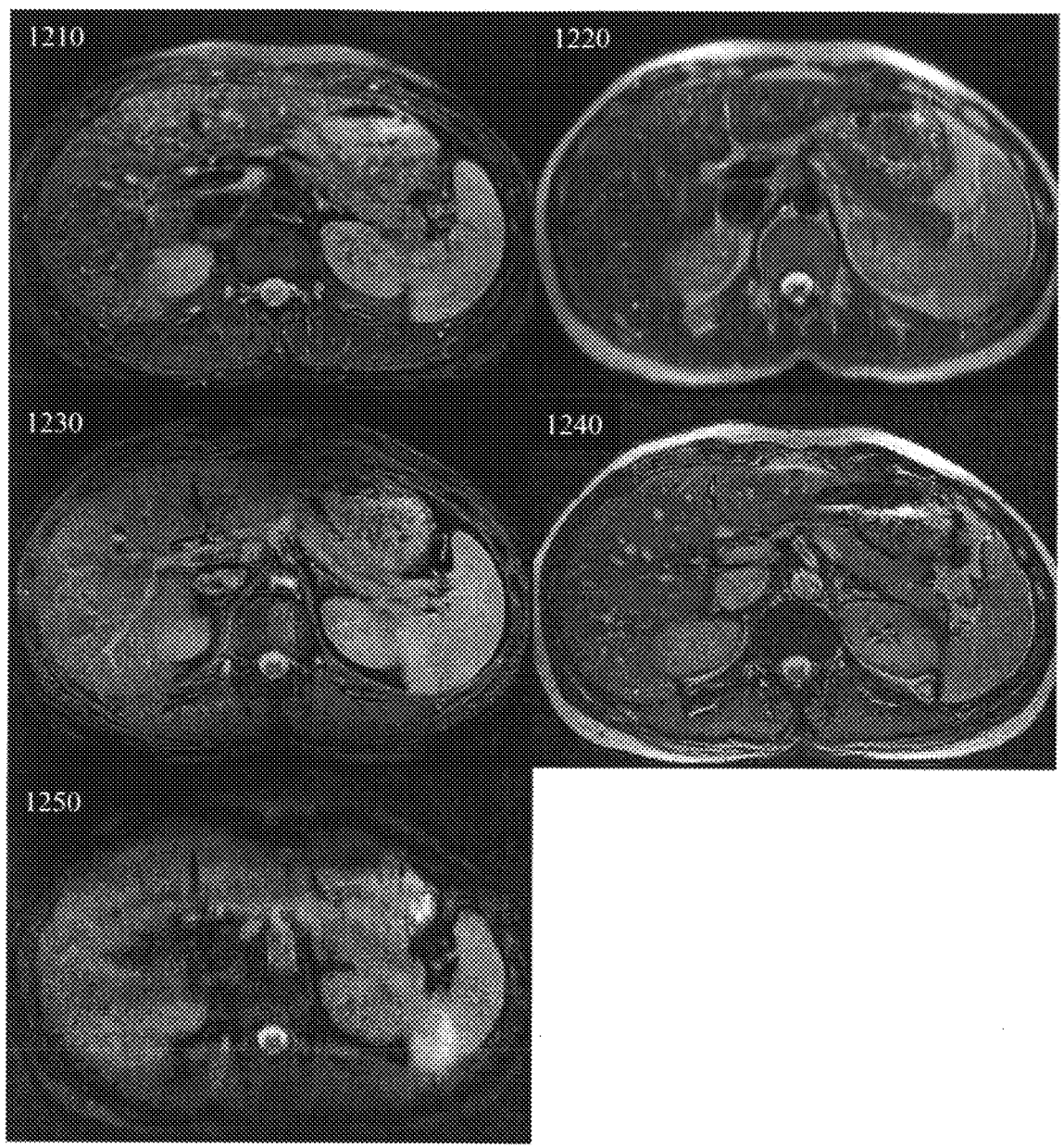
FIG. 12 illustrates images associated with TSE, HASTE, RE-TOSSI, TrueFISP and TOSSI.

FIG. 12 compares sequences by illustrating images acquired in the abdomen of a healthy human volunteer in the transverse plane. Image 1210 illustrates fat-saturated T2W TSE. Note the T$_2$ contrast and distinct edges suggesting a limited loss of resolution. Note also the presence of breathing artifacts since the volunteer could not hold their breath for the entire acquisition time and the incomplete fat saturation at the anterior abdominal wall. Image 1220 illustrates the HASTE imaging result. Note the apparent loss in resolution throughout the image, with the loss being worse in muscle and fat. Note also the hyperintense fat signal and the hypointense signal compared to TSE in the liver and pancreas. Image 1230 shows the RE-TOSSI images with $\lambda$=0.2. Note the similarity in contrast between the RE-TOSSI image 1230 and the TSE image 1210. The similarity in resolution between the images suggests an acceptable point spread function and the homogeneously hypointense signal from fat. Image 1240 shows a TrueFISP image. Note the hyperintense fat signal as well as limited loss of resolution in the steady state image. Image 1250 shows a traditional TOSSI image of the same location. Note the T2 contrast but severe degradation of spatial resolution.

Table 2 shows a comparison of image acquisition time and average RF energy deposition for the images shown in FIG. 12. RE-TOSSI provides a 60% faster acquisition than TOSSI. RE-TOSSI is also 27% faster than the HASTE acquisition. Compared to both techniques there is 74% reduction in average RF power transmission.

TABLE 2

Imaging time and RF power deposition comparison for in-vivo transverse imaging (FIG. 12)

| Sequence | Acquisition time/slice (sec) | Average transmitted power (W) |
| --- | --- | --- |
| RE-TOSSI | 0.76 | 90.8 |
| TOSSI | 1.91 | 354.0 |
| TrueFISP | 0.54 | 87.8 |
| HASTE | 1.04 | 346.3 |
| TSE | 39.35[a] | 194.0 |

[a]Total TSE acquisition time (no savings per slice)

To determine and compare the off-resonance properties of examples of TOSSI and RE-TOSSI ($\lambda$=0.3), the Bloch equation simulations were repeated using the following parameters: TR=5 msec, FA=50°, T2opt=60 msec, 1 rpd and 140 readouts. The T1/T2 of the simulated spins were 250/60 msec. $-2\pi$ to $2\pi$ radians (in steps 0.1 radian) off-resonance precession per TR was included. For comparison, simulations of bSSFP with the same off-resonance precession angles were performed using the same TR, flip angle, number of readouts and T1/T2 values.

Figure 13:
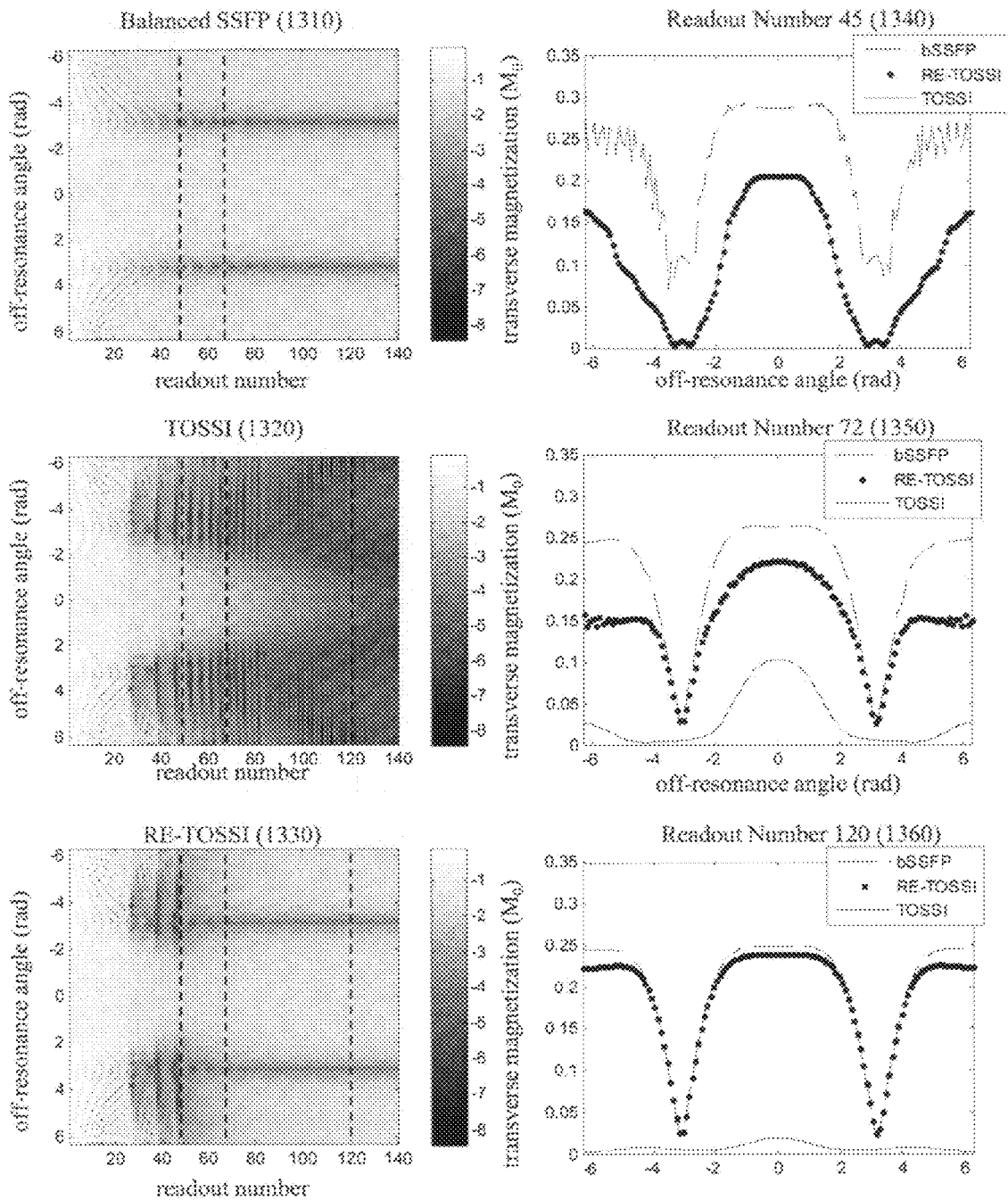
FIG. 13 illustrates several charts associated with TrueFISP, TOSSI and RE-TOSSI.

FIG. 13 illustrates the results of off-resonance simulations. Images 1310-1330 demonstrate the off-resonance properties of example bSSFP, TOSSI, and RE-TOSSI respectively throughout the acquisition of 140 readouts. The images 1310 through 1330 illustrate the log of the transverse magnetization plotted as a function of off-resonance angle and readout number. Note the characteristic banding pattern of bSSFP in image 1310 and the widened bands of TOSSI in image 1320. In image 1330, note the similar bands of RE-TOSSI compared to TOSSI during the beginning of the acquisition (e.g., readouts 1-50) and the significantly narrower bands after the inversion pulses have been stopped (e.g., readouts 51-140).

In order to demonstrate the off-resonance properties in more detail, the transverse magnetization was plotted as a function of off-resonance angle for readout numbers 45, 72, and 120. These readout numbers correspond to signal levels during the initial 1340, transition 1350, and final 1360 portions of the RE-TOSSI acquisition. The off-resonance profiles for the three acquisitions during readout number 45 are plotted in image 1340. The FWHM of the off-resonance bands are 1.2 rad for bSSFP while TOSSI and RE-TOSSI have identical off-resonance profiles with a FWHM of 3.4 rad, which is 2.8 times wider. After the inversions are stopped, the RE-TOSSI off-resonance profiles begin to diverge from those of TOSSI. The off-resonance profiles are plotted for readout number 72 in image 1350. Note that the FWHM for the bSSFP and RE-TOSSI are both 1.1 rad while that of TOSSI has increased to 4.8 rad, which is 4.4 times wider. The off-resonance profiles are plotted again for one of the later readouts (e.g., number 120). The RE-TOSSI FWHM is the same as that for bSSFP (1.0 rad) while the TOSSI FWHM is 4.9 rad, which is 4.9 times wider. Note that the magnitude of the transverse magnetization of TOSSI decreases throughout the acquisition, while that of RE-TOSSI remains fairly constant (around 0.2).

Figure 14:
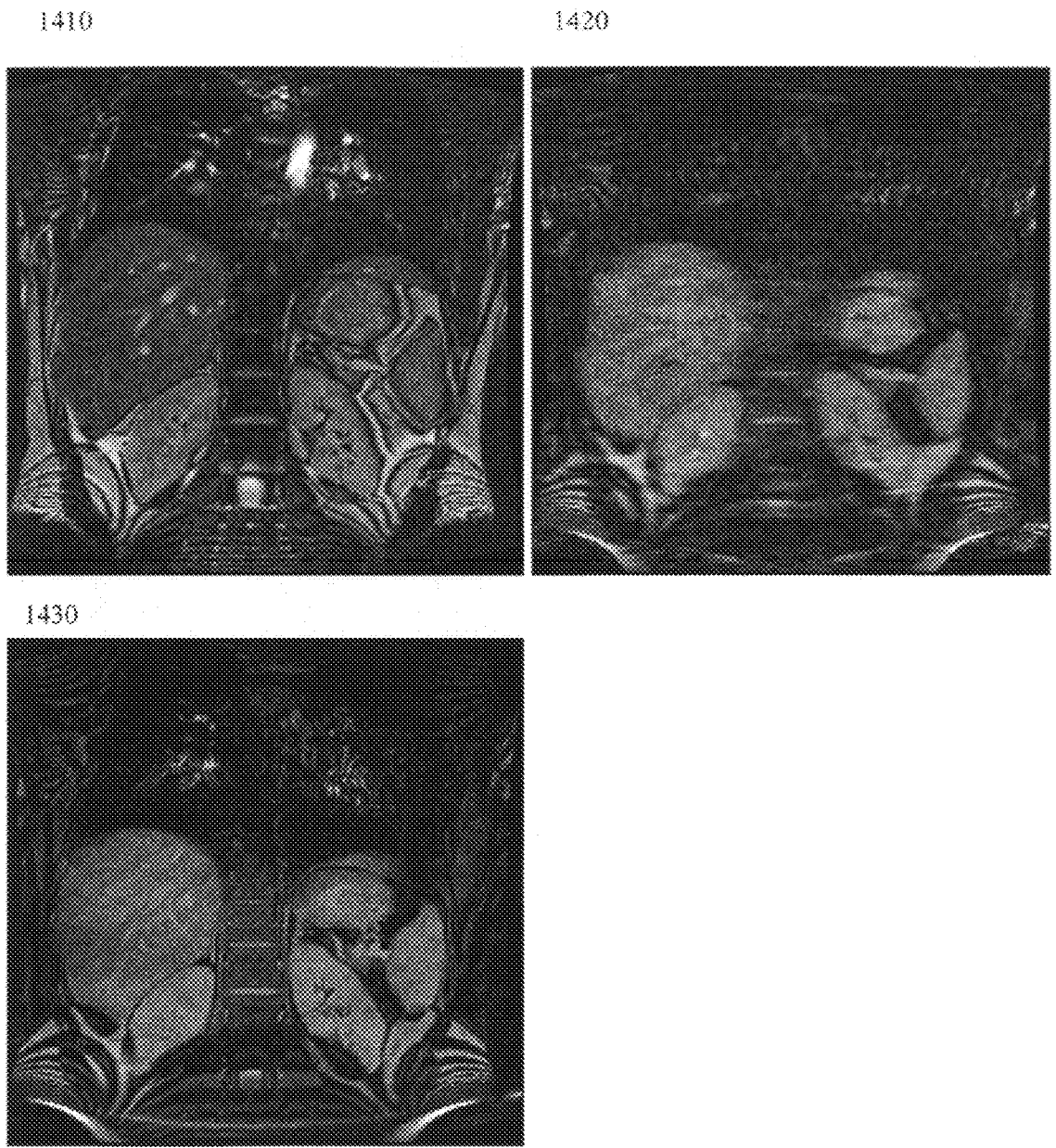
FIG. 14 illustrates images associated with TrueFISP, TOSSI and RE-TOSSI.

To investigate the nature and extent of the off-resonance banding properties of examples of TOSSI and RE-TOSSI in vivo, the bSSFP, TOSSI and RE-TOSSI sequences were used to acquire 350 mm×350 mm FOV images (256×256 matrix) with 5 mm slice thickness in the coronal plane in the same short bore magnet in a different asymptomatic volunteer. FIG. 14 illustrates coronal images acquired from an asymptomatic volunteer thorax and abdomen and demonstrates the in-vivo off-resonance banding properties of bSSFP 1410, TOSSI 1420, and RE-TOSSI ($\lambda$=0.2) 1430. Note the characteristic banding pattern of bSSFP (figure 1410) as the field homogeneity decreases toward the ends of the magnet as illustrated at the top and bottom of the image. Note that the bands for TOSSI and RE-TOSSI appear similar in size and location to each other. They also occur in the same places as those of bSSFP but are wider in size. As was also demonstrated in the transverse plane images, the RE-TOSSI image has improved spatial resolution compared to TOSSI.

The on-resonance simulations illustrated in FIG. 10 show that the loss in spatial resolution associated with single-shot TOSSI images in the abdomen (image 1250 (FIG. 12) and image 1420 (FIG. 14)) is due to a lack of signal in the outer regions of k-space (image 1010 (FIG. 10)). The decay of the transverse magnetization during data acquisition leads to a widened point-spread function (image 1030 (FIG. 10)) which is convolved with the underlying anatomical information producing the degradation of spatial resolution in the phase encoding direction. The PSF is tissue dependent due to differences in T1 and T2 across tissues. During TOSSI the signal from each tissue oscillates around the prolonged pure T2 decay curve at low flip angles given by equation 4. In one example of RE-TOSSI, the inversion pulses are removed from the TOSSI pulse sequence after acquiring the center of k-space, the region associated with generating contrast. This allows T1 relaxation effects to restore the magnetization to the balanced SSFP value (image 1020 (FIG. 10)) instead of forcing the magnetization to continue to decay via the conventional TOSSI pattern (image 840 (FIG. 8), image 1010 (FIG. 10)). In one example, inversion pulses are removed when the magnetization is in the aligned state so that the magnetization continually increases instead of being brought to zero. This facilitates producing a more constant signal in k-space leading to a narrower point spread function (image 1030 (FIG. 10)) and having more signal to encode the outer regions of k-space that are associated with providing resolution (image 1020 (FIG. 10)). The adjustable parameter λ determines at what point the inversions are stopped and also modifies the decay curves and point spread functions. Therefore, example RE-TOSSI systems and methods may reduce the width of the point spread function to where it approaches a near ideal PSF (image 1030 (FIG. 10)).

The agarose phantom results illustrated in FIG. 11 highlight some of the limitations of some conventional imaging techniques. These limitations include lack of T2 contrast (image 1120) and degradation of spatial resolution in the single-shot techniques for short T2 species (image 1130), as often found in abdominal imaging. Example RE-TOSSI systems and methods are capable of maintaining the T2 contrast obtained using TOSSI (image 1160) while improving high resolution information (e.g., edge conspicuity (image 1140)). The preparatory pulses in the TOSSI and RE-TOSSI sequences prior to readout were used to establish the T2 contrast in the partial Fourier acquisition. Because of the prolonged decay at the lower flip angles, a longer effective echo time is needed for similar contrast. In this TOSSI technique, magnetization does not decay as quickly and therefore the single shot TOSSI images (image 1160) are less blurry than the HASTE images (image 1130). Alternatively, instead of using preparatory pulses, initial TOSSI pulses may encode some of the more negative lines of k-space that were skipped in the partial Fourier acquisition. The RE-TOSSI images demonstrate that T2-weighting can be maintained even for very small values of λ (image 1140). These results highlight the role of the center of k-space in determining image contrast. The edge response functions (image 1170) demonstrate the loss in spatial resolution associated with the different techniques. Quantitative analysis by means of the modulation transfer function as illustrated in image 1180 and table 1 demonstrate that example RE-TOSSI systems and methods improve the resolution properties of TOSSI to near those of TSE and bSSFP.

Figure 8:
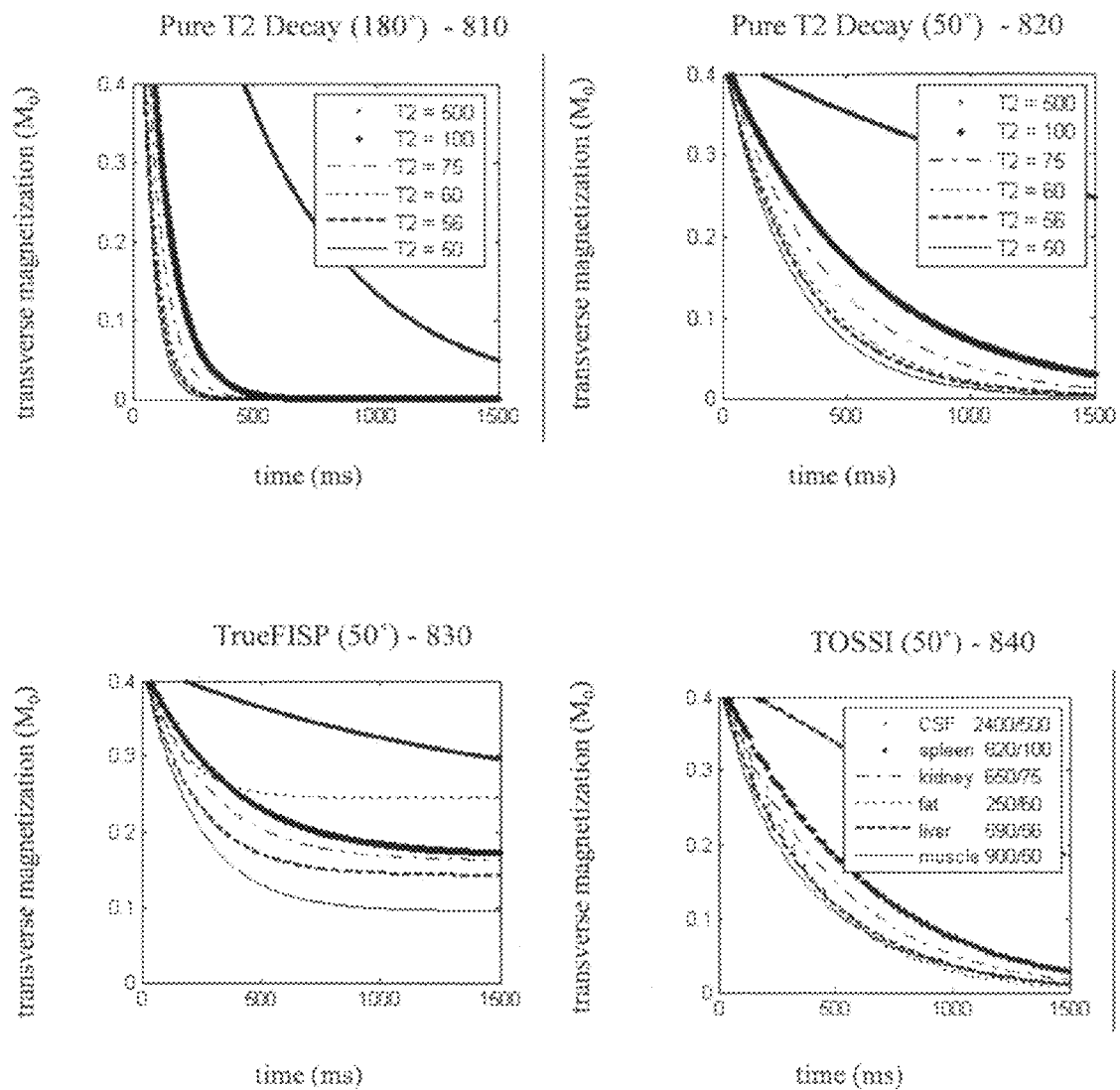
FIG. 8 illustrates several charts associated with pure T2 decay, TrueFISP and TOSSI.

The human abdominal imaging results (image 1230 (FIG. 12), image 1430 (FIG. 14)) demonstrate the in vivo potential of generating fast T2-weighted images using RE-TOSSI. RE-TOSSI reduced the apparent loss in spatial resolution seen in the traditional TOSSI image (image 1250 (FIG. 12), image 1420 (FIG. 14)) and produced an in-vivo image with similar contrast to the fat-suppressed T2-weighted TSE (image 1210 (FIG. 12)). The excellent field homogeneity in the transverse plane allowed the acquisition of TOSSI (image 1230 (FIG. 12)) and RE-TOSSI images (image 1250 (FIG. 12)) of the human abdomen free from major banding artifacts despite the widened regions of off-resonance signal loss associated with TOSSI as illustrated in image 1340 (FIG. 13). The low fat signal in image 1230 (FIG. 12) and image 1250 (FIG. 12) is due, at least in part, to the low T2 value of fat. This low T2 value of fat leads to a low intrinsic signal value in TOSSI as illustrated in 840 (FIG. 8). There is a degree of additional TR and magnetic field homogeneity dependent suppression of fat caused by the off-resonance properties of TOSSI. The intrinsic hypointense fat signal is an attractive aspect of TOSSI since no additional time needs to be spent on fat saturation. No additional time is spent given that the other methods of generating fast T2 contrast produce a hyperintense fat signal (e.g., image 1220 (FIG. 12)) and fat suppression methods can be prone to failure as illustrated in image 1210 (FIG. 12) of the anterior abdominal wall.

In RE-TOSSI, there is a reduction in imaging time as compared to TOSSI due to the removal of inversion pulses and the associated steady state storage and preparation pulses and spoiling gradients. Assuming a patient breath hold of 22 seconds, the current image 2D acquisition time of 0.76 sec/image would allow ~29 slices to be acquired in a single breath hold. For 5 mm slices this corresponds to 14 cm of continuous coverage, corresponding to the average size of the liver at the midclavicular line. With a parallel imaging acceleration factor of 2, by introducing a slight gap between the slices or by increasing the slice thickness to 8 mm, it will be possible to cover the liver of most patients in a single breath hold.

RE-TOSSI produces a reduction in the average energy deposition compared to TOSSI as illustrated in table 2. In one example the reduction achieved 74%. This decrease in average energy deposition is caused by the elimination of energy intensive adiabatic inversion pulses. As implemented, some TOSSI examples approached the higher end of the allowed specific absorption rate (SAR) values (~90% of allowed). RE-TOSSI demonstrates one of the lower SAR values (~25% of allowed), which is only slightly above that of bSSFP. Since SAR scales with the square of the Larmor frequency, the fourfold decrease in SAR will make it possible, from an RF energy deposition perspective, to use the RE-TOSSI sequence at higher fields (e.g., >1.5 T) for the fast generation of T2 contrast without further modifications.

Off-resonance simulations as illustrated in FIG. 13 have shown that TOSSI as currently implemented with α/2 preparation and storage pulses has widened areas of low signal as a function of off-resonance angle throughout k-space compared to bSSFP. This signal behavior corresponds to wider bands in TOSSI images (image 1420 (FIG. 14)) in regions of inhomogeneous magnetic field than seen in conventional bSSFP acquisitions as illustrated in image 1410 (FIG. 14). Signal reduction occurs when magnetic field inhomogeneity exceeds 0.75 ppm. Example RE-TOSSI acquisition techniques demonstrate better off-resonance properties than TOSSI as illustrated in image 1320 (FIG. 13) and image 1330 (FIG. 13). During the TOSSI portion of a RE-TOSSI acquisition, the off-resonance properties are the same as illustrated in image 1340 (FIG. 13). However, after the inversion pulses are stopped, the off-resonance band widths begin to decrease as illustrated in image 1350 (FIG. 13). The off-resonance band widths go back to the more narrow bSSFP case in the later portion of the acquisition as illustrated in 1160 (FIG. 11). The width of the bands in image 1420 (FIG. 14) and image 1430 (FIG. 14) will be essentially equivalent since they are determined by contrast at the center of k-space. There is high resolution information that is gained in RE-TOSSI in the regions where the low signal become narrower compared to the TOSSI acquisition as illustrated in image 1350 (FIG. 13) and image 1360 (FIG. 13). This corresponds to less ghosting and a gain in resolution for some off-resonant species. The widened bands illustrated in image 1340 (FIG. 13) during the TOSSI portion of the acquisition that occur around the center of k-space further suppress the fat signal beyond the already intrinsically low fat signal in TOSSI when an appropriate TR is used. For example, TRs between 1.1-3.3 milliseconds and 5.6-7.8 milliseconds will suppress the fat signal by a factor of two or greater. The in-vivo coronal RE-TOSSI image 1430 (FIG. 14) demonstrates that even in a short bore magnet similar to that used in the studies reported herein there is a large region (20-25 cm) around the center of the magnet that is free from the majority of the banding artifacts. This validates the use of RE-TOSSI.

Similar to other combined acquisition techniques, RE-TOSSI includes a parameter λ, which in this case characterizes the fraction of k-space acquired using TOSSI. Combined acquisition techniques have used different pulse sequence blocks in various regions of K-space. In RE-TOSSI, the fundamental repeating imaging block is balanced SSFP with the same parameters (e.g. same flip angle, bandwidth, etc) throughout the sequence. RE-TOSSI includes a TOSSI portion and a non-inverting non-TOSSI portion. There does not appear to be "an instantaneous jump" in signal amplitude between the inverting and the non-inverting portions. This jump may not appear when the fundamental repeating units in both portions are similar. In RE-TOSSI, λ characterizes the pure T2-weighting throughout k-space in the RE-TOSSI sequence and the magnetization's approach to the bSSFP steady state value. λ can be chosen so that the resulting image retains T2-weighting provided by TOSSI while also improving spatial resolution, imaging time, off-resonance signal loss and RF energy deposition.

While Cartesian RE-TOSSI acquisitions have been described and experimentally verified it is to be appreciated that RE-TOSSI can be used with non-Cartesian data acquisition techniques. For example, RE-TOSSI can be used to improve the resolution of TOSSI using annular ring or concentric ring data acquisition schemes. The rings around the center of k-space can be acquired using TOSSI and then the outer k-space rings can be acquired with a non-TOSSI, non-inverting sequence. The signal in the outer regions of k-space will be increased using RE-TOSSI and similar improvements in spatial resolution, acquisition time, RF power deposition and off-resonance properties will be realized compared to a pure TOSSI sequence.

Figure 15:
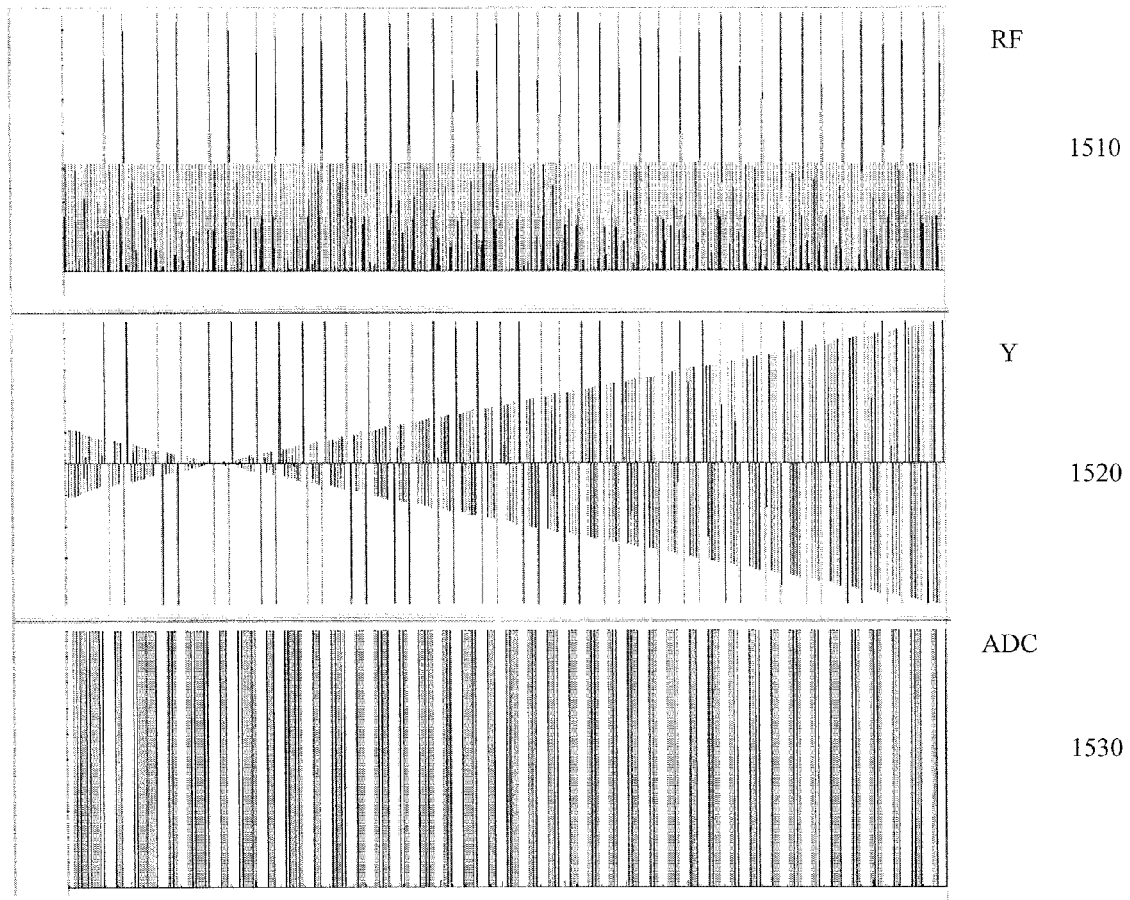
FIG. 15 illustrates an example TOSSI sequence and related information.
Figure 16:
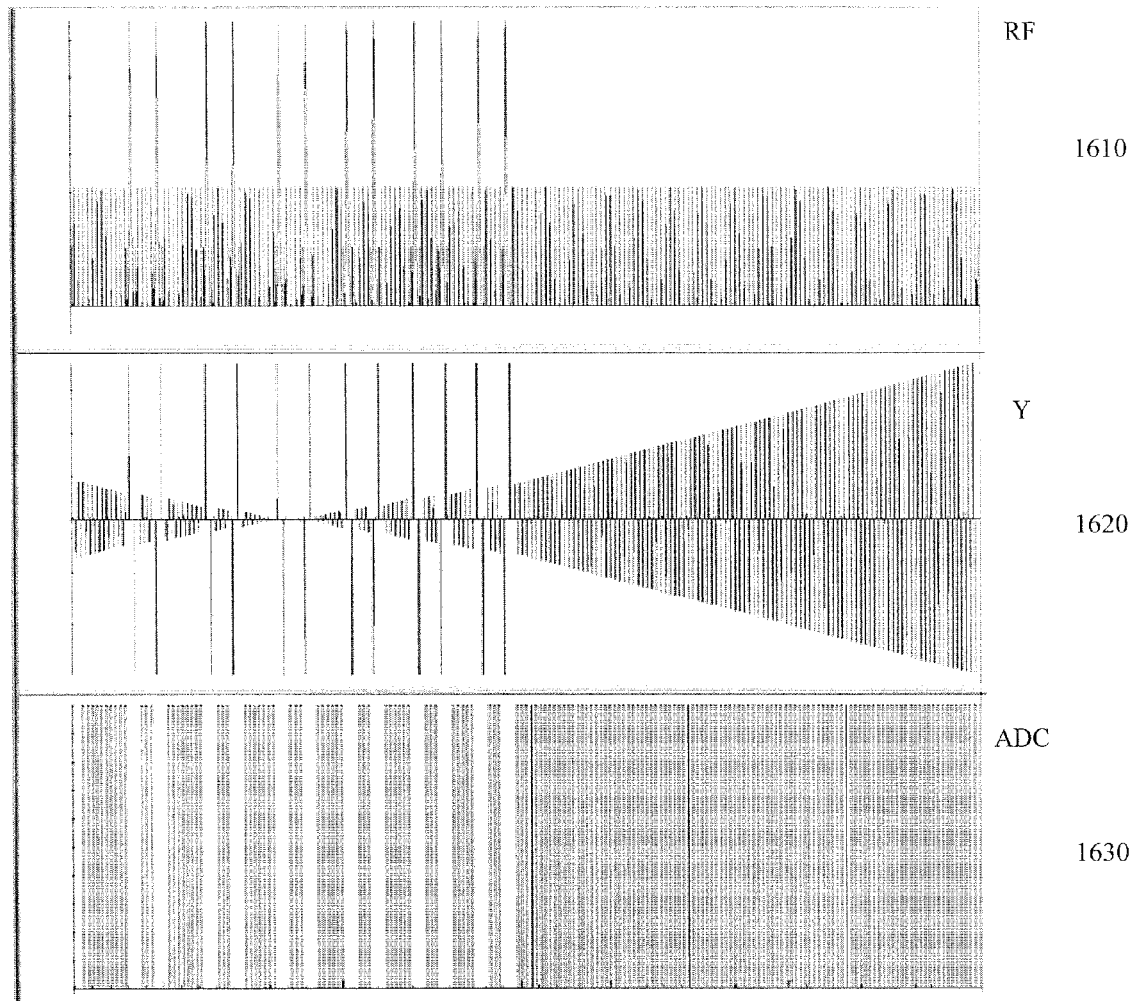
FIG. 16 illustrates an example RE-TOSSI sequence and related information.
Figure 17:
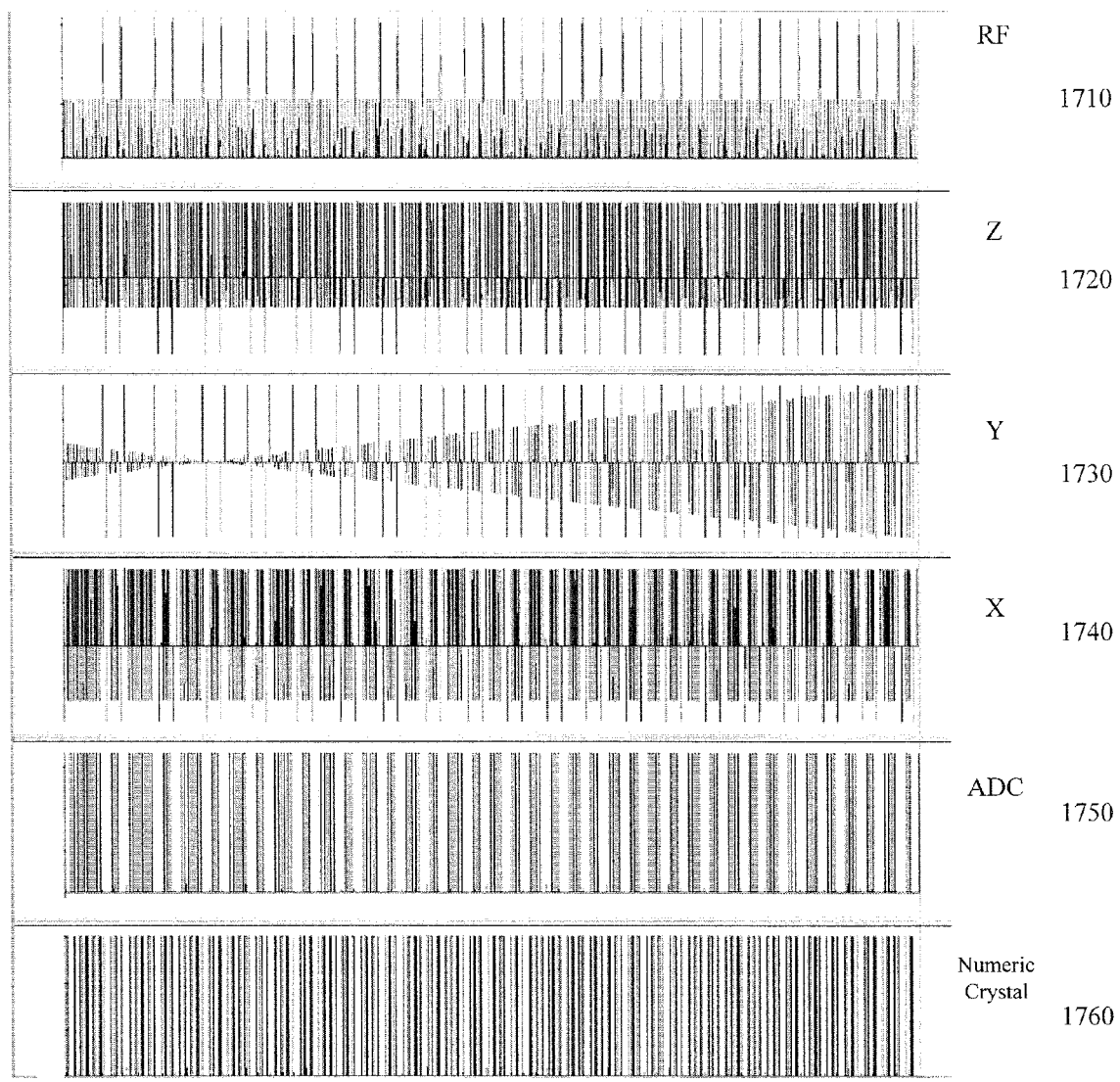
FIG. 17 illustrates an example TOSSI sequence and related information.
Figure 18:
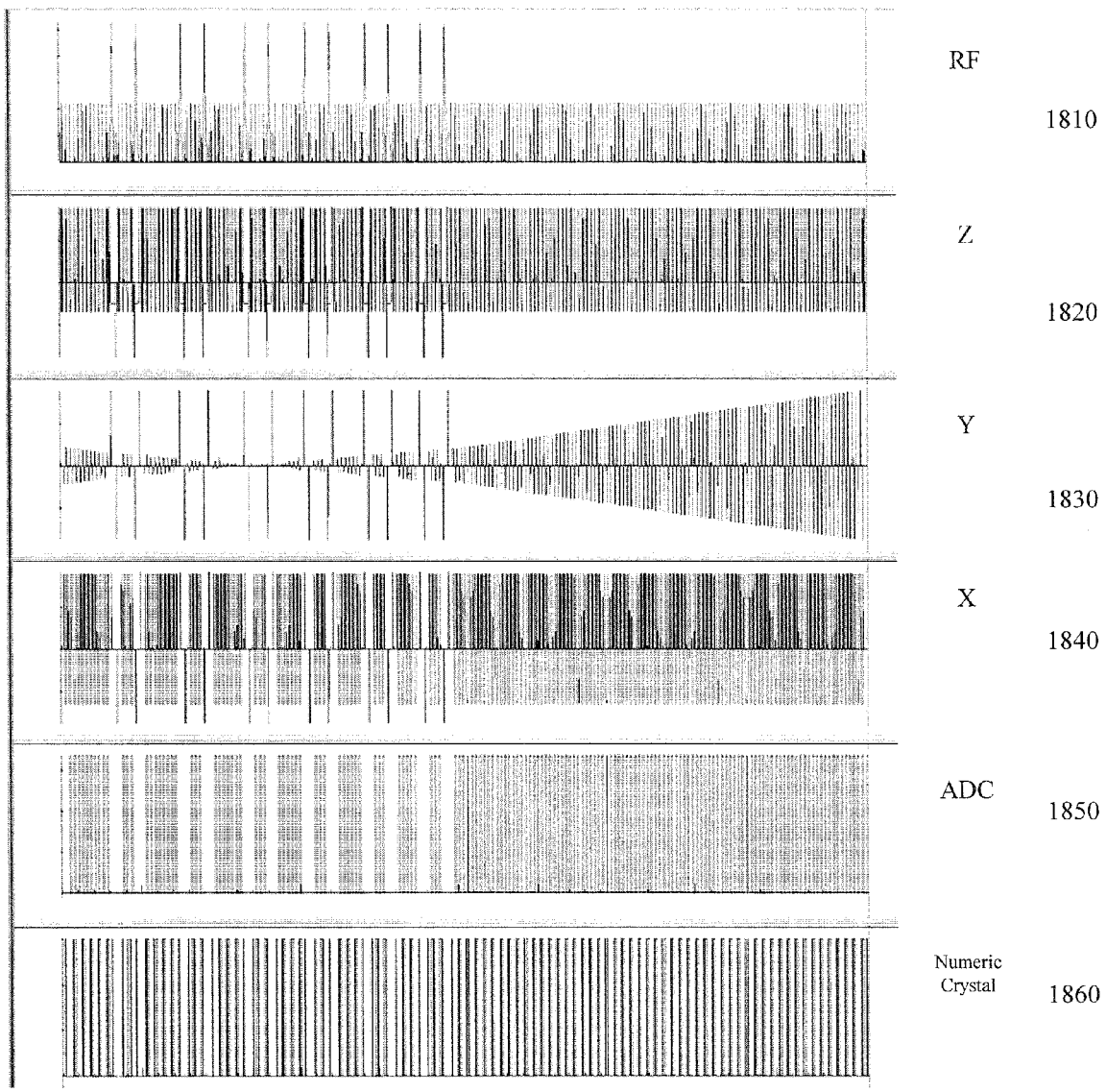
FIG. 18 illustrates an example RE-TOSSI sequence and related information.

FIG. 15 illustrates RF signal data, Y gradients, and ADC signal data associated with an example TOSSI sequence. FIG. 16 illustrates RF signal data, Y gradients and ADC signal data associated with a RE-TOSSI sequence. FIG. 17 illustrates RF signal data, Z gradients, Y gradients, X gradients, and ADC signal data associated with an example TOSSI sequence. FIG. 18 illustrates RF signal data, Z gradients, Y gradients, X gradients, and ADC signal data associated with an example RE-TOSSI sequence.

Figure 19:
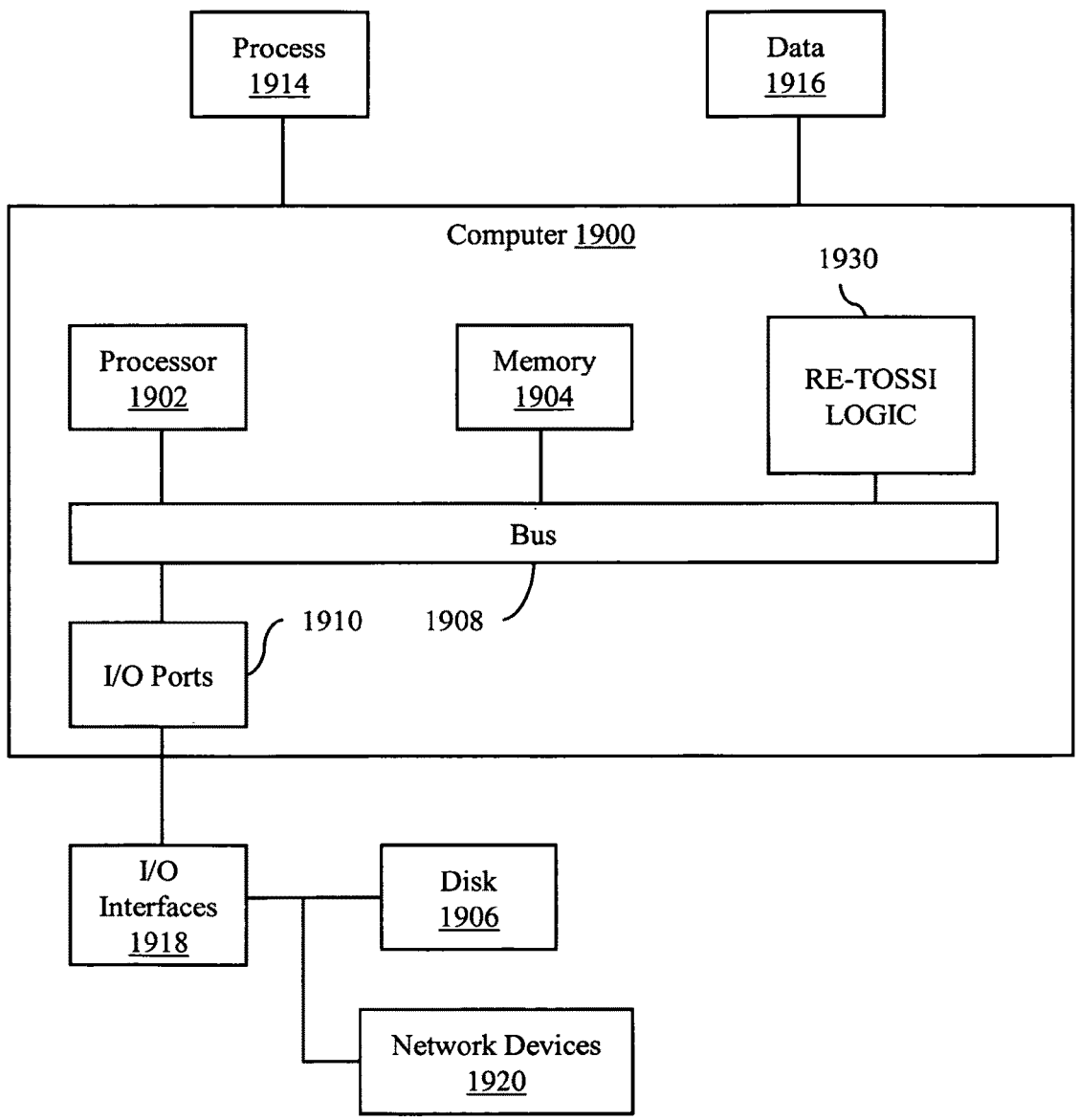
FIG. 19 illustrates an example computing environment in which example systems and methods, and equivalents, may operate.

FIG. 19 illustrates an example computing device with which example systems and methods described herein, and equivalents, may interact. The example computing device may be a computer 1900 that includes a processor 1902, a memory 1904, and input/output ports 1910 operably connected by a bus 1908. In one example, the computer 1900 may include a RE-TOSSI logic 1930 configured to facilitate producing a RE-TOSSI pulse sequence and receiving signal data in response to the RE-TOSSI signal. In different examples, the logic 1930 may be implemented in hardware, software, firmware, and/or combinations thereof. Thus, the logic 1930 may provide means (e.g., hardware, software, firmware) for generating a sequence having two parts, a first pure T2-weighted segment and a second T1-T2 segment, where the T2-weighted segment acquires signal in and around the center of k-space. While the logic 1930 is illustrated as a hardware component attached to the bus 1908, it is to be appreciated that in one example, the logic 1930 could be implemented in the processor 1902.

Generally describing an example configuration of the computer 1900, the processor 1902 may be a variety of various processors including dual microprocessor and other multi-processor architectures. A memory 1904 may include volatile memory and/or non-volatile memory. Non-volatile memory may include, for example, ROM, PROM, EPROM, and EEPROM. Volatile memory may include, for example, RAM, synchronous RAM (SRAM), dynamic RAM (DRAM), synchronous DRAM (SDRAM), double data rate SDRAM (DDR SDRAM), and direct RAM bus RAM (DRRAM). Computer 1900 may be operably connected to and/or incorporated into an MRI apparatus.

A disk 1906 may be operably connected to the computer 1900 via, for example, an input/output interface (e.g., card, device) 1918 and an input/output port 1910. The disk 1906 may be, for example, a magnetic disk drive, a solid state disk drive, a floppy disk drive, a tape drive, a Zip drive, a flash memory card, and/or a memory stick. Furthermore, the disk 1906 may be a CD-ROM, a CD recordable drive (CD-R drive), a CD rewriteable drive (CD-RW drive), and/or a digital video ROM drive (DVD ROM). The memory 1904 can store a process 1914 and/or a data 1916, for example. The disk 1906 and/or the memory 1904 can store an operating system that controls and allocates resources of the computer 1900.

The bus 1908 may be a single internal bus interconnect architecture and/or other bus or mesh architectures. While a single bus is illustrated, it is to be appreciated that the computer 1900 may communicate with various devices, logics, and peripherals using other busses (e.g., PCIE, SATA, Infiniband, 1394, USB, Ethernet). The bus 1908 can be types including, for example, a memory bus, a memory controller, a peripheral bus, an external bus, a crossbar switch, and/or a local bus.

The computer 1900 may interact with input/output devices via the i/o interfaces 1918 and the input/output ports 1910. Input/output devices may be, for example, a keyboard, a microphone, a pointing and selection device, cameras, video cards, displays, the disk 1906, the network devices 1920, and so on. The input/output ports 1910 may include, for example, serial ports, parallel ports, and USB ports.

The computer 1900 can operate in a network environment and thus may be connected to the network devices 1920 via the i/o interfaces 1918, and/or the i/o ports 1910. Through the network devices 1920, the computer 1900 may interact with a network. Through the network, the computer 1900 may be logically connected to remote computers. Networks with which the computer 1900 may interact include, but are not limited to, a local area network (LAN), a wide area network (WAN), and other networks.

Figure 20:
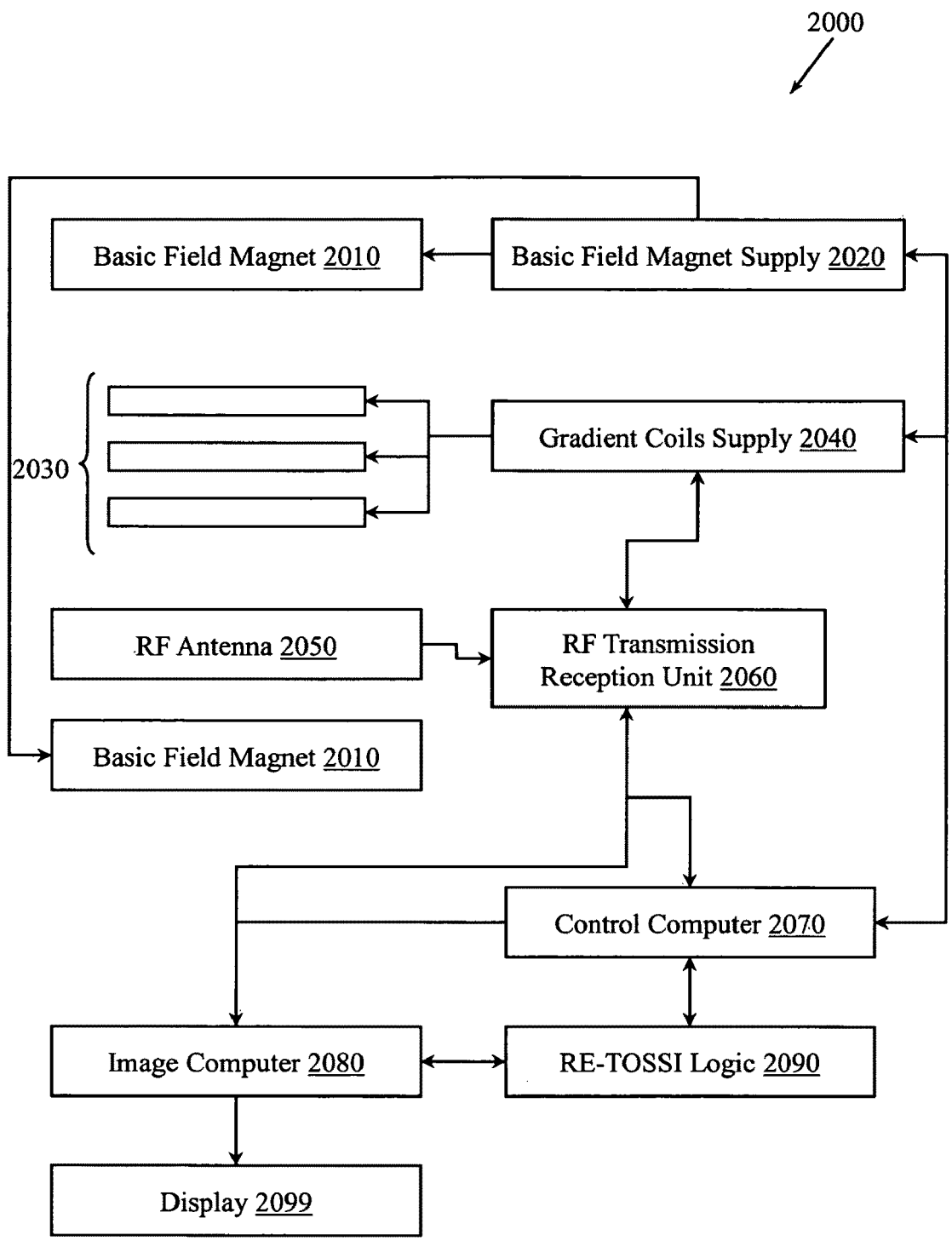
FIG. 20 illustrates an example MRI apparatus with which example systems and methods, and equivalents may operate.

FIG. 20 illustrates an example MRI apparatus 2000 that includes a RE-TOSSI logic 2090. The apparatus 2000 includes a basic field magnet(s) 2010 and a basic field magnet supply 2020. Ideally, the basic field magnets 2010 would produce a uniform $B_0$ field. However, in practice, the $B_0$ field may not be uniform, and may vary over an object being imaged by the MRI apparatus 2000. MRI apparatus 2000 may include gradient coils 2030 configured to emit gradient magnetic fields like $G_S$, $G_P$ and $G_R$. The gradient coils 2030 may be controlled, at least in part, by a gradient coils supply 2040.

MRI apparatus 2000 may also include an RF antenna 2050 that is configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. In one example, separate RF transmission and reception coils can be employed. The RF antenna 2050 may be controlled, at least in part, by an RF transmission-reception unit 2060. The gradient coils supply 2040 and the RF transmission-reception unit 2060 may be controlled, at least in part, by a control computer 2070. In one example, the control computer 2070 may be programmed to perform methods like those described herein (e.g., generate RE-TOSSI sequence).

The magnetic resonance signals received from the RF antenna 2050 can be employed to generate an image, and thus may be subject to a transformation process like a two dimensional FFT that generates pixilated image data. The transformation can be performed by an image computer 2080 or other similar processing device. The image data may then be shown on a display 2099. While an MR apparatus 2000 is illustrated, it is to be appreciated that in some examples RE-TOSSI may be employed with other imaging apparatus and/or methods (e.g., spectroscopy).

While FIG. 20 illustrates an example MRI apparatus 2000 that includes various components connected in various ways, it is to be appreciated that other MRI apparatus may include other components connected in other ways. In one example, to implement the example systems and methods described herein, MRI apparatus 2000 may be configured with a RE-TOSSI logic 2090. In different examples, RE-TOSSI logic 2090 may be permanently and/or removably attached to an MRI apparatus. While RE-TOSSI logic 2090 is illustrated as a single logic connected to control computer 2070 and image computer 2080, it is to be appreciated that RE-TOSSI logic 2090 may be distributed between and/or operably connected to other elements of apparatus 2000. RE-TOSSI logic 2090 may execute portions of the methods described herein.

Figure 21:
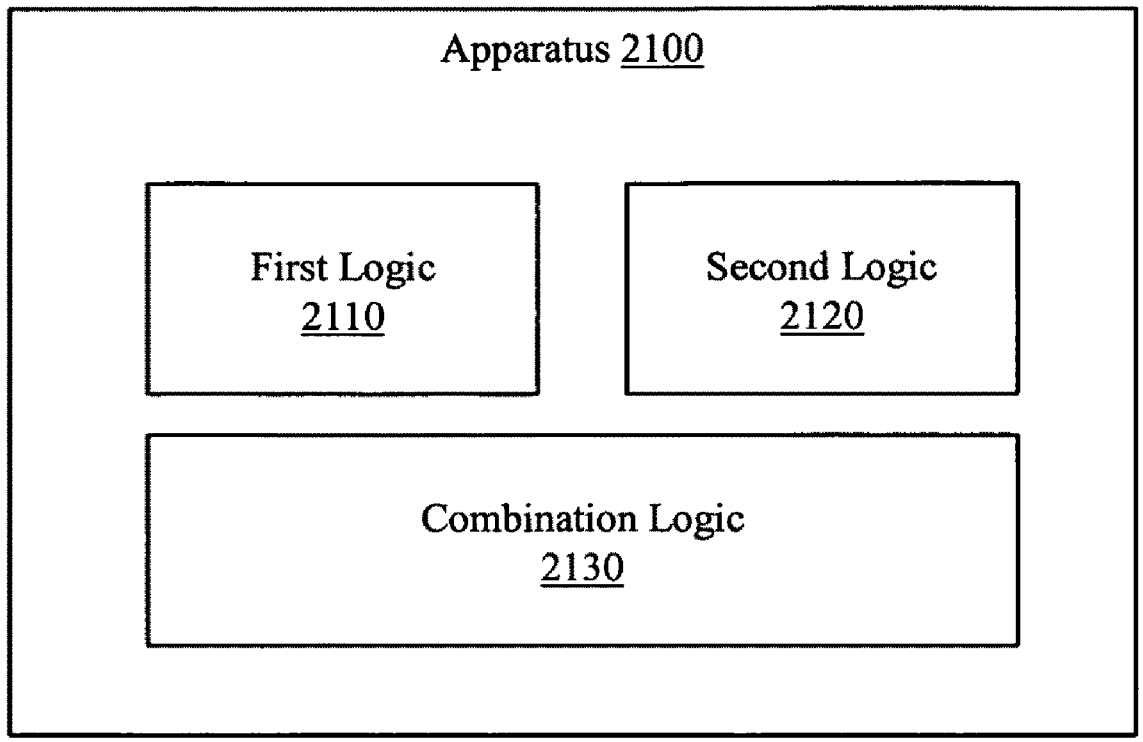
FIG. 21 illustrates an example apparatus associated with RE-TOSSI.

FIG. 21 illustrates an example apparatus 2100 associated with RE-TOSSI. Apparatus 2100 comprises a first logic 2110 to produce a TOSSI pulse sequence having at least three inversion pulses. In one example, the spacing between the at least three inversion pulses is not equal. Apparatus 2100 also comprises a second logic 2120 to produce a non-inverting, non-TOSSI pulse sequence. The non-inverting, non-TOSSI pulse sequence does not include inversion pulses associated with a TOSSI pulse sequence. Apparatus 2100 also comprises a combination logic 2130 to provide a combined acquisition technique pulse sequence. The combined acquisition technique pulse sequence comprises a first portion provided by the first logic 2110 and a second portion provided by the second logic 2120. The first portion precedes the second portion. In one example, the first portion is configured to acquire data associated with a center region of a k-space associated with an object to be imaged. In the example, the second portion is configured to acquire data associated with an outer region of the k-space. In one example, the second portion may be a bSSFP portion.

In one example, the at least three inversion pulses are to be distributed in a low flip angle BSSFP acquisition. In one example, at least three inversion pulses are configured to balance signal gained and lost via T1 relaxation in states parallel and anti-parallel to a main magnetic field produced by an imaging system controlled by the apparatus 2100.

In one example, apparatus 2100 may also include a trajectory logic to control a data sampling trajectory performed by an imaging apparatus controlled by the apparatus 2100. The data sampling trajectory may be, for example, a Cartesian data sampling trajectory, and a non-Cartesian data sampling trajectory.

Apparatus 2100 may provide the combined acquisition technique pulse to different imaging apparatus. For example, the apparatus 2100 may provide the combined acquisition technique pulse sequence to a magnetic resonance imaging (MRI) apparatus and/or and a spectroscopy apparatus. In one example, the apparatus 2100 provides the combined acquisition technique pulse sequence to an MRI apparatus and controls the MRI apparatus so that magnetization produced by the MRI apparatus approaches a steady state value in the outer regions of k-space.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 22:
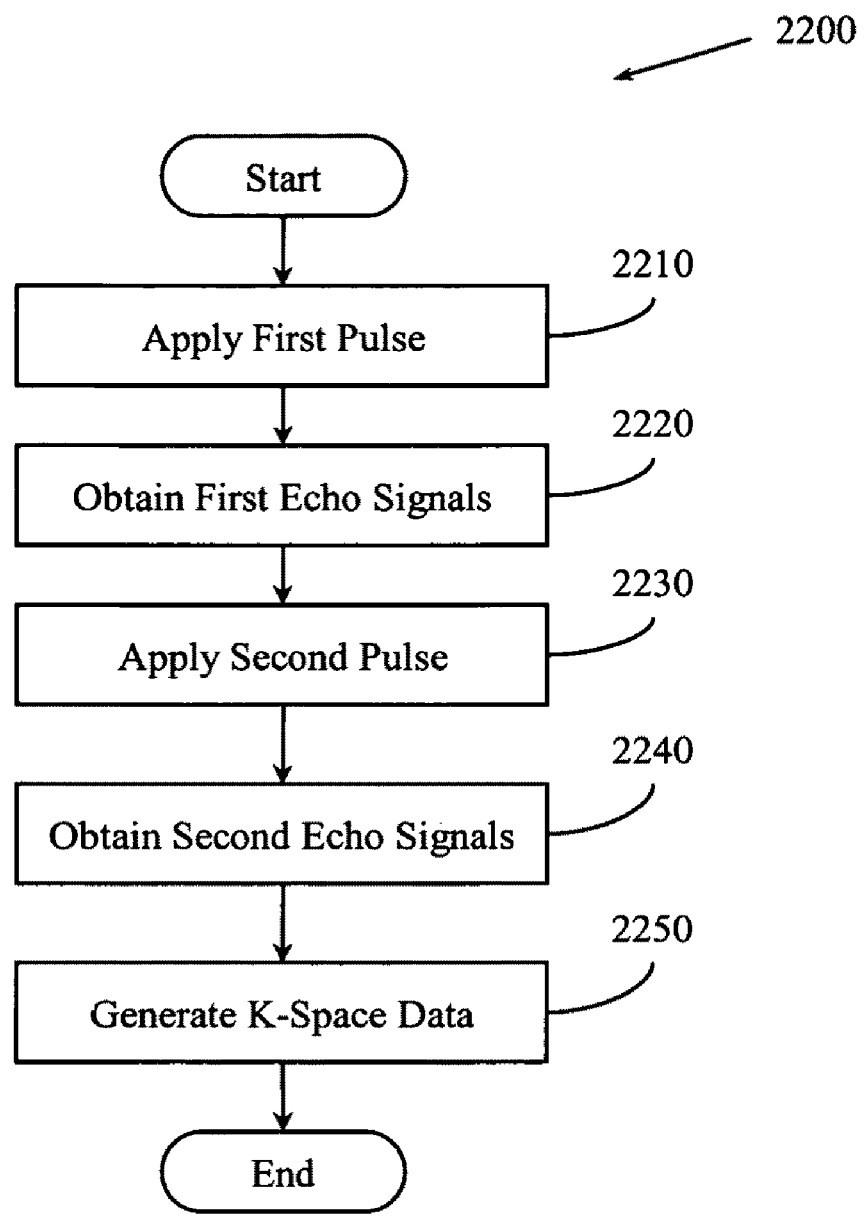
FIG. 22 illustrates a method associated with RE-TOSSI.

FIG. 22 illustrates a method 2200. Method 2200 includes, at 2210, controlling an imaging apparatus to apply a first pulse sequence to a subject in a magnetic field produced by the imaging apparatus. The first pulse sequence is configured to isolate T2 contrast. The imaging apparatus may be, for example, an MRI apparatus.

Method 2200 also includes, at 2220, controlling the imaging apparatus to obtain a first set of echo signals in response to the application of the first pulse sequence. In one example, applying the first pulse sequence includes encoding a central region of a k-space associated with the subject. In the example, acquiring the first set of echo signals includes acquiring data associated with the central region of the k-space.

Method 2200 also includes, at 2230, controlling the imaging apparatus to apply a second pulse sequence to the subject. The second pulse sequence is configured to acquire both T1 and T2 contrast.

Method 2200 also includes, at 2240, controlling the imaging apparatus to obtain a second set of echo signals in response to the application of the second pulse sequence.

Method 2200 also includes, at 2250, generating a combined k-space data set from first set of echo signals and the second set of echo signals. In one example, an image may be reconstructed from the combined k-space data set.

The combination of the first pulse sequence and the second pulse sequence produces superior results when compared to only applying the first pulse sequence. For example, a point spread function associated with a k-space data set acquired using a combination of the first pulse sequence and the second pulse sequence may have a first width. However, a point spread function associated with a k-space data set acquired using only the first pulse sequence will have a second width, and the first width will be less than the second width. Similarly, a combination of the first pulse sequence and the second pulse sequence may yield a first RF deposition when applied for a defined period of time while applying only the first pulse sequence for the defined period of time will yield a second RF deposition. The first RF deposition will be less than the second RF deposition. The superior results may also be noticed in image resolution. For example, a combination of the first pulse sequence and the second pulse sequence may yield a first image having a first resolution in a first period of time while applying only the first pulse sequence may yield a second image having a second resolution in the first period of time. Results indicate that the first resolution will be greater than the second resolution. The superior results may also be noticed in off-resonance properties. For example, a first image acquired using a combination of the first pulse sequence and the second pulse sequence will exhibit a first off-resonance property while a second image acquired using only the first pulse sequence will exhibit a second off-resonance property, Results indicate that the first off-resonance property will be superior to the second off-resonance property.

In one example, instructions to control a method may be implemented as computer executable instructions. Thus, in one example, a computer-readable medium may store computer executable instructions that if executed by a machine (e.g., processor) cause the machine to perform a method. While executable instructions associated with one method are described as being stored on a computer-readable medium, it is to be appreciated that executable instructions associated with other example methods described herein may also be stored on a computer-readable medium.

Figure 23:
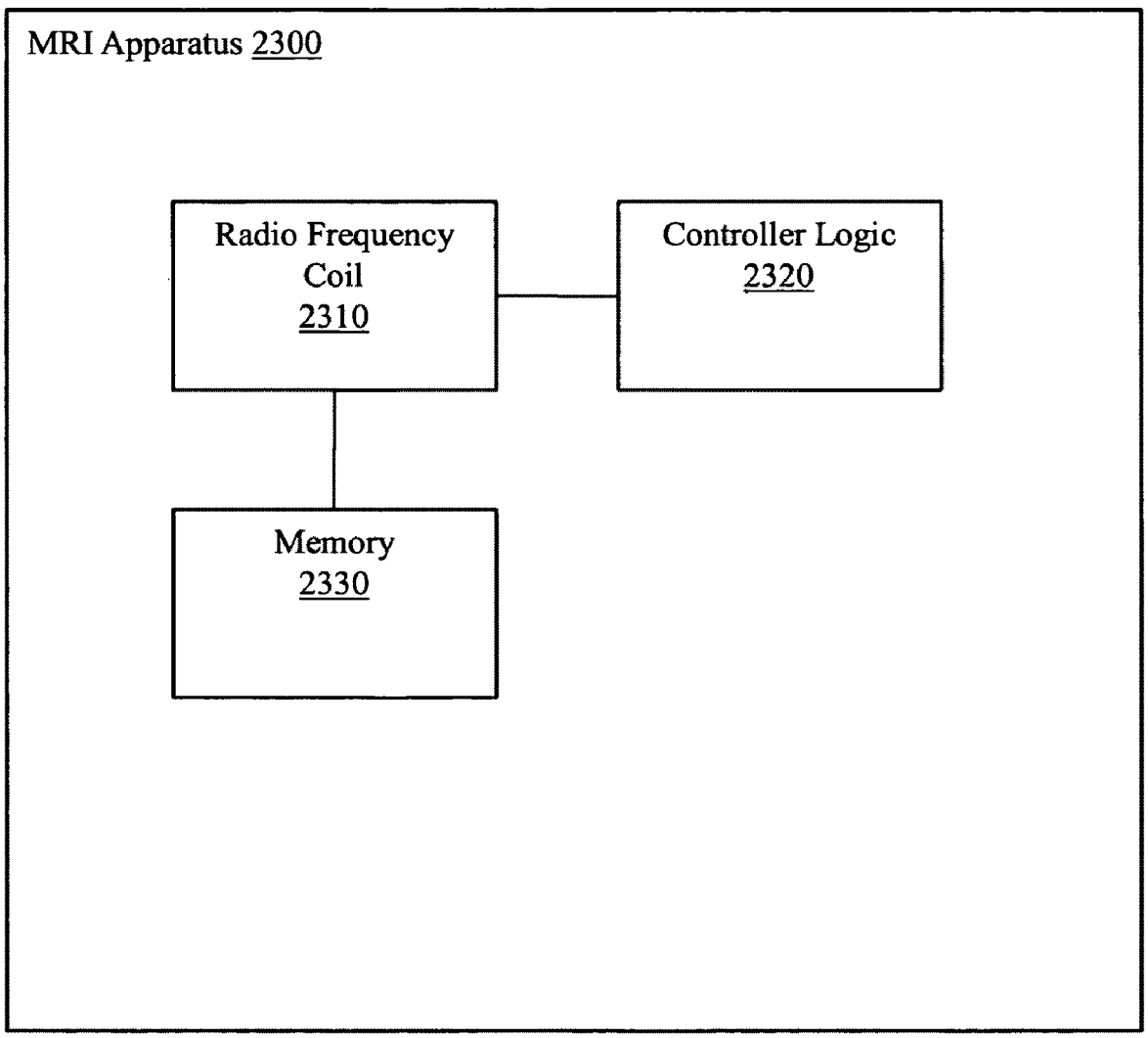
FIG. 23 illustrates an MRI apparatus associated with RE-TOSSI.

FIG. 23 illustrates an MRI apparatus 2300 associated with RE-TOSSI. Apparatus 2300 includes at least one radio frequency (RF) coil 2310 configured to generate and receive RF signals. Apparatus 2300 also includes a controller logic 2320. The controller logic 2320 will control the RF coil 2310 to generate a first RF pulse sequence that includes non-uniformly spaced inversion pulses. The controller logic 2320 will also control the RF coil 2310 to receive primarily T2 weighted echo signal data in response to applying the first RF pulse sequence to a subject to be imaged. The controller logic 2320 will also control the RF coil 2310 to generate a second RF pulse sequence including no inversion pulses. The controller logic 2320 will also control the RF coil 2310 to receive T1 and T2 weighted echo signal data in response to applying the second RF pulse sequence to the subject to be imaged.

Apparatus 2300 also includes a memory 2330. Memory 2330 will store the primarily T2 weighted echo signal data in a k-space data set and also store the T1 and T2 weighted echo signal data in the k-space data set. In one example, the first RF pulse sequence is to encode the center of k-space. Therefore, the center of the k-space data set is to store data from the pure T2 weighted echo signal data.

In one example, magnetization produced by the MRI apparatus 2300 is to approach a steady state value in the outer regions of k-space. The MRI apparatus 2300 may perform different types of sampling. For example, the MRI apparatus 2300 may perform a Cartesian data sampling trajectory, and/or a non-Cartesian data sampling trajectory. One skilled in the art will appreciate that controller logic 2320 may control the MRI apparatus 2300 to perform two dimensional and/or three dimensional imaging. Therefore, the first RF pulse sequence and the second RF pulse sequence may be controlled to perform three-dimensional RE-TOSSI.

Figure 24:
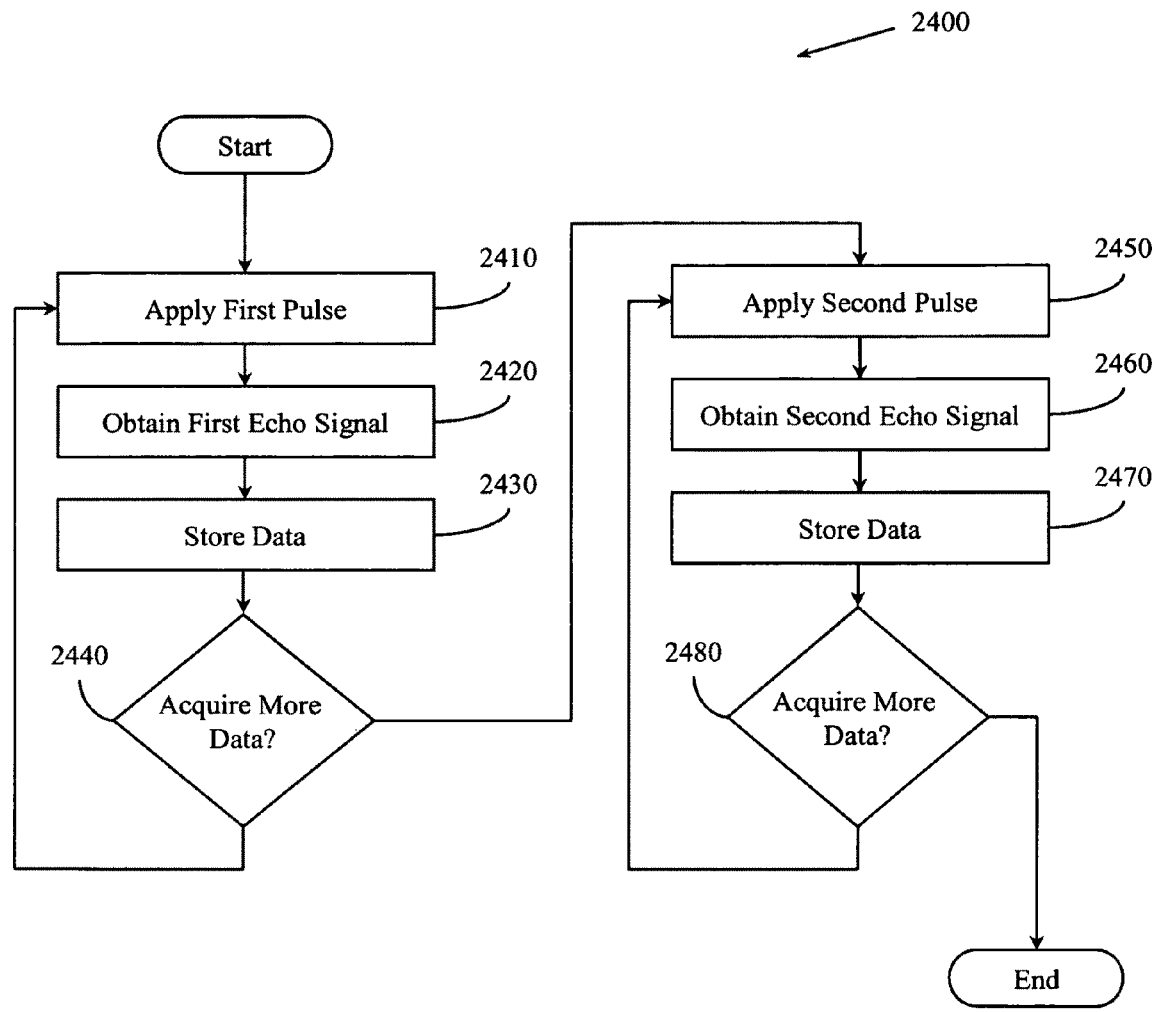
FIG. 24 illustrates a method associated with RE-TOSSI.

FIG. 24 illustrates a method 2400 associated with RE-TOSSI. Method 2400 includes two loops where actions may be performed repetitively. In the first loop, method 2400 includes, at 2410, applying a first steady state RF pulse sequence to an area of a subject. The first steady state RF pulse sequence has three or more non-uniformly spaced inversion pulses. Method 2400 also includes, at 2420, obtaining a first echo signal in response to applying the first steady state RF pulse sequence at 2410. Method 2400 also includes, at 2430, storing data derived from the first echo signal in a k-space data set. This inverting (e.g., TOSSI) portion of a pulse sequence may be applied one or more times. Therefore, method 2400 includes, at 2440, determining whether to repeat the set of actions 2410 through 2430.

When the determination is made, method 2400 proceeds to the second loop. In the second loop, method 2400 includes, at 2450, applying a second steady state RF pulse sequence to the area of the subject. The second steady state RF pulse sequence has no inversion pulses. It is not a TOSSI sequence. Method 2400 also includes, at 2460, obtaining a second echo signal in response to applying the second steady state RF pulse sequence at 2450. Method 2400 also includes, at 2470, storing data derived from the second echo signal in the k-space data set. The second loop may continue until a determination is made at 2480 to acquire no more data.

In one example, method 2400 may also include reconstructing an image from the k-space data set. In one example, the first RF pulse sequence is configured to produce a signal having a first strength in outer regions of k-space. In this example, the second RF pulse sequence is configured to produce a signal having a second strength in outer regions of k-space. The second signal strength is greater than the first signal strength.

Acquiring data first using the TOSSI portion and then acquiring data using a non-TOSSI portion may yield improved analytic measurements for a reconstructed image. For example, a point spread function associated with a k-space data set acquired using a combination of the first RF pulse sequence and the second RF pulse sequence may have a more narrow width than a point spread function associated with a k-space data set acquired using only the first RF pulse sequence.

Figure 25:
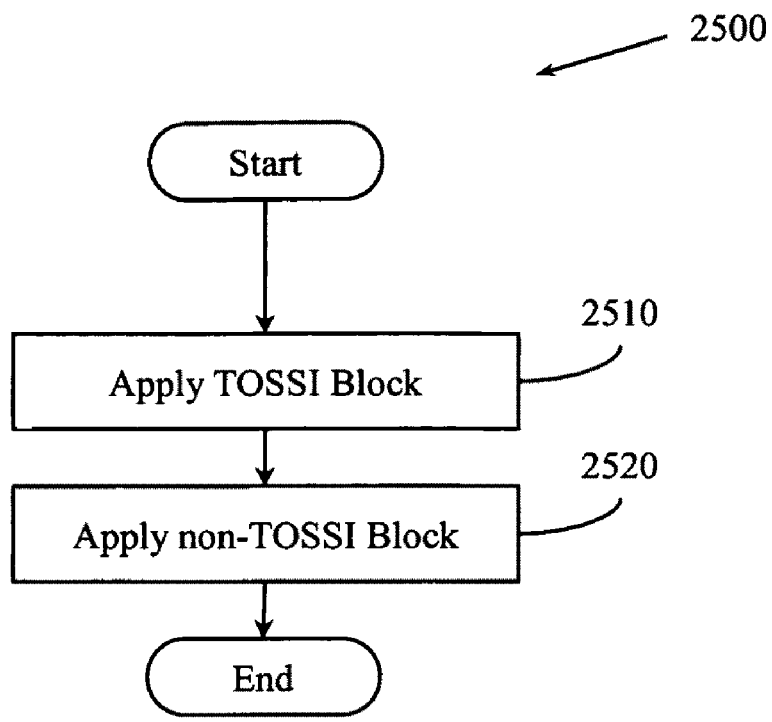
FIG. 25 illustrates a method associated with RE-TOSSI.

FIG. 25 illustrates a combined acquisition technique 2500. Method 2500 includes, at 2510, first controlling an MRI apparatus to apply a first RF energy to an object for a first period of time. The first RF energy is controlled by an initial TOSSI imaging block. Method 2500 also includes, at 2520, controlling the MRI apparatus to subsequently apply a second RF energy to the object for a second period of time. The second RF energy is controlled by a set of non-inverting, non-TOSSI acquisitions. Thus, the combined acquisition technique includes first applying a TOSSI imaging block and then applying a non-TOSSI imaging block.

In one example, members of the set of non-inverting, non-TOSSI acquisitions provided at 2520 are not identical. In one example, the periods of time for which the first RF energy (TOSSI) is applied at 2510 and the second RF energy (non-TOSSI) is applied at 2520 are configurable. In one example, the center of k-space is to be encoded during the first period of time and the outer regions of k-space are to be encoded during the second period of time. One skilled in the art will appreciate that the proportions of a space denoted as a center region and as an outer region will vary depending on the ratio between the first period of time and the second period of time.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An apparatus compatible with magnetic resonance imaging, comprising:
   a processor;
   a memory;
   a set of logics; and
   an interface to connect the processor, the memory, and the set of the logics the set of logics comprising:
      a first logic that produces a T1-insensitive steady state imaging (TOSSI) pulse sequence portion having at least three inversion pulses, where the spacing between the at least three inversion pulses is not equal;
      a second logic that produces a non-inverting, non-TOSSI pulse sequence portion, where the non-inverting, non-TOSSI pulse sequence portion does not include inversion pulses associated with a TOSSI pulse sequence, and where imaging blocks are not interwoven between inversion pulses of the TOSSI sequence; and
      a combination logic that provides a single combined pulse sequence comprising:
         an initial portion of the single combined pulse sequence that is the initial TOSSI pulse sequence portion that is to be applied until the magnetization is in an aligned state; and
         a subsequent portion that is the non-TOSSI pulse sequence portion that is to be applied when the magnetization is in the aligned state,
         where the initial TOSSI pulse sequence portion is followed directly by the non-TOSSI pulse sequence portion in the single combined pulse sequence, and
         where the apparatus provides the single combined pulse sequence to a magnetic resonance imaging (MRI) apparatus.

2. The apparatus of claim 1, where the at least three inversion pulses are to be distributed in a low flip angle bSSFP acquisition.

3. The apparatus of claim 2, where the at least three inversion pulses balance signal gained and lost via T1 relaxation in states parallel and anti-parallel to a main magnetic field produced by an imaging system controlled by the MRI compatible apparatus.

4. The apparatus of claim 1, where the first portion acquires data associated with a center region of a k-space associated with an object to be imaged, and where the second portion acquires data associated with an outer region of the k-space associated with the object to be imaged.

5. The apparatus of claim 1, where the single combined pulse sequence acquires information sufficient to produce a Resolution enhanced T1-insensitive steady state imaging (Re-TOSSI) image superior to a TOSSI image while applying less than 50% of the radio frequency as compared to a TOSSI sequence and in less than 50% of the time required in order to acquire information sufficient to produce a TOSSI image.

6. The apparatus of claim 1, including a trajectory logic in order to control a data sampling trajectory performed by an imaging apparatus controlled by the MRI compatible apparatus.

7. The apparatus of claim 6, the data sampling trajectory being one of, Cartesian data sampling, and non-Cartesian data sampling.

8. The apparatus of claim 4, comprising:
   an image displayer that displays a magnetic resonance image formed from the acquired k-space data.

9. The apparatus of claim 1, with the Non TOSSI second portion being one of, a bSSFP portion, a FLASH portion, and an incoherent SSFP portion.

10. The apparatus of claim 1, comprising an image logic that produces a magnetic resonance image from a signal acquired in response to the application of the single combined pulse sequence to a subject.

11. An MRI apparatus, comprising:
    at least one radio frequency (RF) coil that generates and receives RF signals;
    a controller that:
       controls the at least one RF coil in order to provide to a subject to be imaged, a first T1-insensitive steady state imaging (TOSSI) RF pulse sequence portion including non-uniformly spaced inversion pulses and
       controls the at least one RF coil in order to provide to the subject a second Non-TOSSI RF pulse sequence portion including no inversion pulses, and where imaging blocks are not interwoven between the inversion pulses of the first TOSSI sequence portion; where the at least one RF coil is controlled in order to combine first RF pulse sequence portion and the second RF pulse sequence portion directly into a single combined pulse sequence;
    where the single combined pulse sequence is a Resolution enhanced T1-insensitive steady state imaging (Re-TOSSI) pulse sequence; and
       controls the at least one RF coil in order to receive echo signal data in response to the application of the single combined pulse sequence to the subject; and
    a memory that stores the echo signal data in a k-space data set and that stores T1 and T2 weighted echo signal data in the k-space data set.

12. The MRI apparatus of claim 11, where the first RF pulse sequence encodes the center of k-space and where the center of the k-space data set is to store data from pure T2 weighted echo signal data.

13. The MRI apparatus of claim 12, where magnetization produced by the MRI apparatus approaches a steady state value in the outer regions of k-space.

14. The MRI apparatus of claim 13, where the MRI apparatus performs one of,
    a Cartesian data sampling trajectory, and
    a non-Cartesian data sampling trajectory.

15. The MRI apparatus of claim 11, where the first RF pulse sequence and the second RF pulse sequence are controlled in order to perform three-dimensional RE-TOSSI.

16. The MRI apparatus of claim 11, comprising:
    an image displayer that displays a magnetic resonance image formed from the k-space data set.

17. A magnetic resonance imaging (MRI) control apparatus, comprising:
    a first circuit that produces a T1-insensitive steady state imaging (TOSSI) pulse sequence portion having at least three inversion pulses, where the spacing between the at least three inversion pulses is not equal, where the inversion pulses cause magnetization in a sample to which the TOSSI pulse sequence portion is applied to decrease towards zero, and where one or more imaging blocks are interwoven between the at least three inversion pulses, the TOSSI pulse sequence portion being T1-insensitive;
    a second circuit that produces a non-inverting, non-TOSSI pulse sequence portion, where the non-inverting, non-TOSSI pulse sequence portion does not include inversion pulses associated with a TOSSI pulse sequence, and where imaging blocks are not interwoven between the inversion pulses associated with the TOSSI pulse sequence portion; and a combination circuit configured to control an MRI apparatus in order to apply a single combined pulse sequence to a subject to be imaged, the single combined pulse sequence comprising the TOSSI pulse sequence portion followed directly by the non-TOSSI pulse sequence portion in the single combined pulse sequence, where the TOSSI pulse sequence portion is to be applied until the magnetization in the sample is in an aligned state and where the non-TOSSI pulse sequence portion is to be applied when the magnetization in the sample is in the aligned state.

18. A non-transitory computer-readable medium storing computer executable instructions that when executed by a computer cause the computer to perform a magnetic resonance imaging (MRI) controlling method, the method, comprising:

first software instructions that control an MRI apparatus in order to produce a T1-insensitive steady state imaging (TOSSI) pulse sequence portion having at least three inversion pulses, where the spacing between the at least three inversion pulses is not equal, where the inversion pulses cause magnetization in a sample to which the TOSSI pulse sequence portion is applied to decrease towards zero, and where one or more imaging blocks are interwoven between the at least three inversion pulses, the TOSSI pulse sequence portion being T1-insensitive;

second software instructions that control the MRI apparatus in order to produce a non-inverting, non-TOSSI pulse sequence portion, where the non-inverting, non-TOSSI pulse sequence portion does not include inversion pulses associated with a TOSSI pulse sequence portion, and where imaging blocks are not interwoven between inversion pulses associated with the TOSSI pulse sequence portion; and third software instructions that control the MRI apparatus in order to apply a single combined pulse sequence to a subject to be imaged, the single combined pulse sequence comprising the TOSSI pulse sequence portion followed directly by the non-TOSSI pulse sequence portion in the single combined pulse sequence, where the TOSSI pulse sequence portion is to be applied until the magnetization in the sample is in an aligned state and where the non-TOSSI pulse sequence portion is to be applied when the magnetization in the sample is in the aligned state.

19. A non-transitory computer-readable medium storing computer executable instructions that when executed by a computer cause the computer to perform a magnetic resonance imaging (MRI) control method, the method comprising:

first firmware that controls an MRI apparatus in order to produce a T1-insensitive steady state imaging (TOSSI) pulse sequence portion having at least three inversion pulses, where the spacing between the at least three inversion pulses is not equal, where the inversion pulses cause magnetization in a sample to which the TOSSI pulse sequence portion is applied to decrease towards zero, and where one or more imaging blocks are interwoven between the at least three inversion pulses, the TOSSI pulse sequence portion being T1-insensitive;

second firmware that controls the MRI apparatus in order to produce a non-inverting, non-TOSSI pulse sequence portion, where the non-inverting, non-TOSSI pulse sequence portion does not include inversion pulses associated with a TOSSI pulse sequence portion, and where imaging blocks are not interwoven between inversion pulses associated with the TOSSI pulse sequence portion; and third firmware that controls the MRI apparatus in order to apply a single combined pulse sequence to a subject to be imaged, the single combined pulse sequence comprising the TOSSI pulse sequence portion followed directly by the non-TOSSI pulse sequence portion in the single combined pulse sequence, where the TOSSI pulse sequence portion is to be applied until the magnetization in the sample is in an aligned state and where the non-TOSSI pulse sequence portion is to be applied when the magnetization in the sample is in the aligned state.

* * * * *